(12) United States Patent
Tsai et al.

(10) Patent No.: US 12,293,918 B2
(45) Date of Patent: May 6, 2025

(54) SEMICONDUCTOR STRUCTURE INCLUDING DISCHARGE STRUCTURES AND METHOD FOR FABRICATING THE SAME

(71) Applicant: TAIWAN SEMICONDUCTOR MANUFACTURING COMPANY LTD., Hsinchu (TW)

(72) Inventors: Yao-Jen Tsai, Kaohsiung (TW); Keng-Hui Liao, Kaohsiung (TW); Chih-Kai Yang, Taichung (TW); Chih-Fu Chang, Pingtung County (TW); Chia-Jen Leu, Tainan (TW); Chin-Yuan Ko, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 506 days.

(21) Appl. No.: 17/352,199

(22) Filed: Jun. 18, 2021

(65) Prior Publication Data
US 2022/0406608 A1    Dec. 22, 2022

(51) Int. Cl.
*H01L 21/3065*    (2006.01)
*H01L 21/768*    (2006.01)
(Continued)

(52) U.S. Cl.
CPC .... *H01L 21/3065* (2013.01); *H01L 21/76802* (2013.01); *H01L 21/76877* (2013.01);
(Continued)

(58) Field of Classification Search
CPC ........... H01L 21/3065; H01L 21/76802; H01L 21/76877; H01L 23/5226; H01L 23/528;
(Continued)

(56) References Cited

U.S. PATENT DOCUMENTS

| 7,091,079 B2 * | 8/2006 | Chen ............... H01L 21/823892 |
| | | 257/E21.639 |
| 7,915,658 B2 * | 3/2011 | Pellela ................... H01L 21/84 |
| | | 257/E21.364 |

(Continued)

*Primary Examiner* — Jami Valentine Miller
*Assistant Examiner* — Pratiksha Jayant Lohakare
(74) *Attorney, Agent, or Firm* — WPAT LAW; Anthony King

(57) ABSTRACT

A method includes providing a substrate of a first conductivity type, the substrate including a first circuit region and a second circuit region; forming a first well region of a second conductivity type in the first circuit region of the substrate; forming a first doped region of the second conductivity type in the first well region; forming a diode in the second circuit region of the substrate; forming a first transistor and a second transistor over the substrate in the first circuit region and the second circuit region, respectively; forming a discharge structure over the substrate to electrically couple the first doped region to the diode; and forming a metallization layer over the discharge structure to electrically couple the first transistor to the second transistor (Continued)

subsequent to the forming of the diode, wherein charges accumulated in the first well region are drained to the substrate through the discharge structure.

20 Claims, 40 Drawing Sheets

(51) Int. Cl.
    *H01L 23/522* (2006.01)
    *H01L 23/528* (2006.01)
    *H01L 27/07* (2006.01)

(52) U.S. Cl.
    CPC ........ *H01L 23/5226* (2013.01); *H01L 23/528* (2013.01); *H01L 27/0727* (2013.01)

(58) Field of Classification Search
    CPC ............... H01L 27/0727; H01L 23/485; H01L 27/0629; H01L 27/0255
    USPC ......................................................... 257/368
    See application file for complete search history.

(56) References Cited

U.S. PATENT DOCUMENTS

| | | | |
|---|---|---|---|
| 9,362,292 B1* | 6/2016 | Liaw | H01L 21/823885 |
| 9,553,508 B1* | 1/2017 | Chu | H01L 27/0266 |
| 10,157,925 B1* | 12/2018 | Kuo | H01L 27/0266 |
| 2002/0053704 A1* | 5/2002 | Avery | H01L 27/0255 257/361 |
| 2003/0047750 A1* | 3/2003 | Russ | H01L 29/7436 257/E29.085 |
| 2011/0024847 A1* | 2/2011 | Morino | H01L 21/823892 257/371 |
| 2011/0147794 A1* | 6/2011 | Gauthier, Jr. | H01L 27/0259 257/E29.225 |
| 2012/0178222 A1* | 7/2012 | Abou-Khalil | G06F 30/30 716/101 |
| 2016/0379983 A1* | 12/2016 | Yen | H01L 27/0928 257/401 |
| 2017/0162558 A1* | 6/2017 | Chu | H01L 27/092 |
| 2017/0323912 A1* | 11/2017 | Lahav | H01L 27/14609 |
| 2018/0061823 A1* | 3/2018 | Weyers | H01L 29/1095 |
| 2018/0301537 A1* | 10/2018 | Weyers | H01L 29/1608 |

\* cited by examiner

SEMICONDUCTOR STRUCTURE INCLUDING DISCHARGE STRUCTURES AND METHOD FOR FABRICATING THE SAME

BACKGROUND

The manufacturing of large-scale integrated circuits (ICs) involves hundreds of discrete processing steps beginning with the introduction of blank semiconductor wafers until a completed chip is formed. Most of these processing steps include depositing layers of material, patterning them by photolithographic techniques, and etching away the unwanted portions. The materials generally include insulators and metals. In some instances, the patterned layers serve as temporary protective masks. In other examples, these patterned layers are used as the functional components of the integrated circuit chip.

Radio-frequency (RF) plasmas may be used extensively in many of these processing steps. For example, among the various etching technologies, reactive ion etching (RIE) provides the etching anisotropy required to achieve a high degree of pattern definition and precise dimensional control. The gaseous chemical etching is assisted by unidirectional ion bombardment provided by an RE plasma. In some other embodiments, photoresist layers are removed with help of plasma asking instead of chemical solvents.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
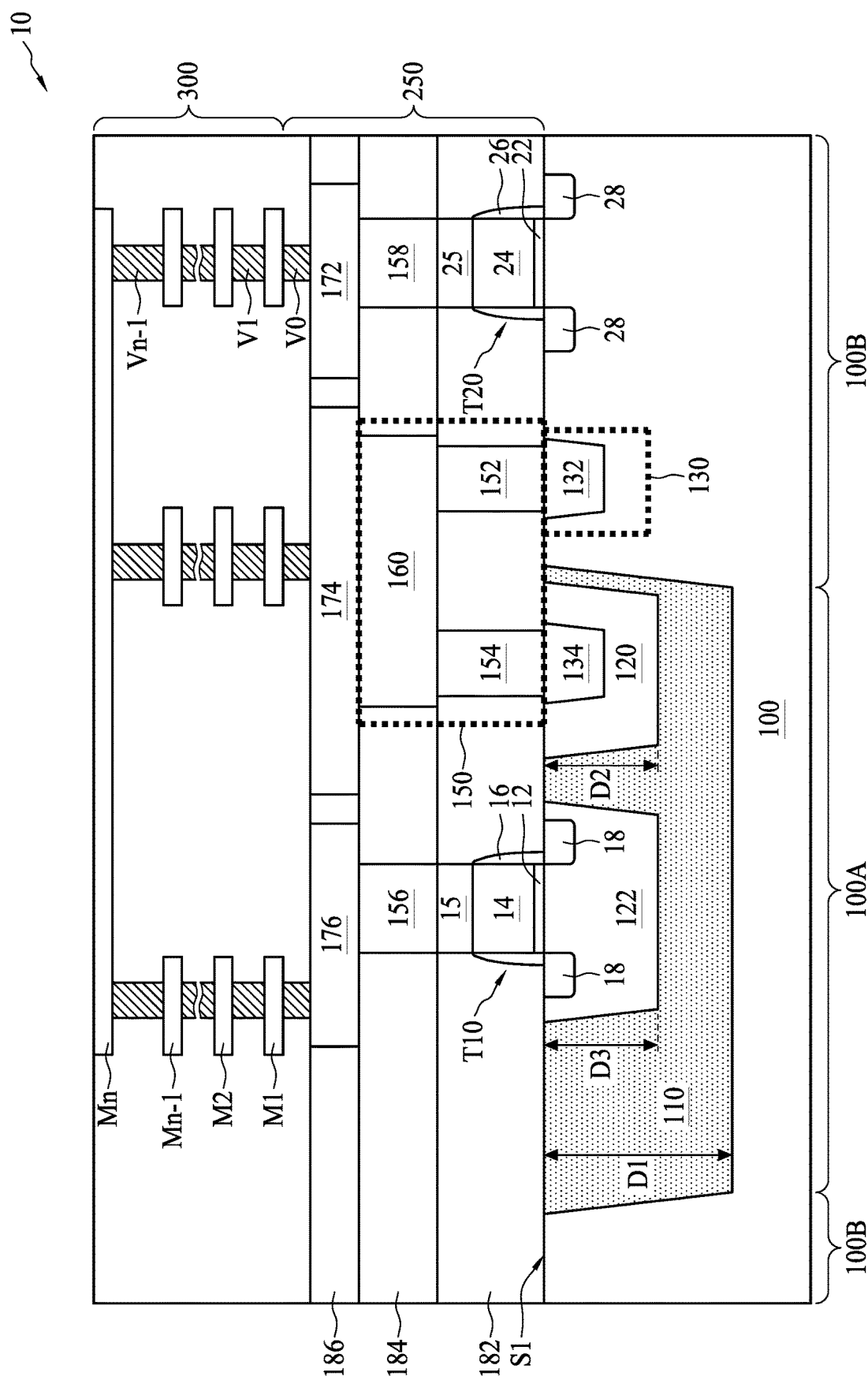
FIG. 1A is a schematic cross-sectional view of a first semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally mean within a value or range which can be contemplated by people having ordinary skill in the art. Alternatively, the terms "substantially," "approximately," or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages, such as those for quantities of materials, durations of times, temperatures, operating conditions, ratios of amounts, and the likes thereof disclosed herein, should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A metal-oxide-semiconductor field-effect-transistor (MOSFET) device is a device including a source terminal and a drain terminal separated by a region, referred to as a channel region of the MOSFET device. The MOSFET device is modulated by applying a voltage to an electrode (gate) which overlies the channel region and is separated from it by a thin insulating layer (generally referred to as a gate dielectric). The simple nature of the MOSFET devices and their minimal heat dissipation permit an extraordinary degree of miniaturization and consequently a high density of circuits.

In the manufacturing of an integrated circuit (IC) using MOSFET technology, processes involving charged ions are widely employed, such as a plasma etching process and an ion implantation process. The charged ions may be supplied using plasma techniques. Although the plasma techniques may improve the operations that are conducted without help of the charged ions, plasma-induced charges may accumulate in some of the layers during operation, thereby increasing the risk of charge damage, Sometimes referred to as an antenna effect or a plasma induced dielectric damage, the plasma induced damage arises from the charge accumulation in isolated features during the processing of an integrated circuit. As an example, during a plasma-enhanced etching process used in forming gate patterns or conductive via patterns, the plasma may produce charges that accumulate on conductive layers or semiconductor layers. The accumulating charges may result in an increased voltage potential across a dielectric layer, such as a gate dielectric below the gate electrode or a dielectric layer serving as an inter-metal dielectric layer. When the resulting voltage potential across the dielectric layer exceeds a threshold, charges may flow into the dielectric layer to become trapped in the gate dielectric or flow through the gate dielectric. These charges may significantly degrade the dielectric strength and cause failures in these MOSFET devices. Thus, the plasma induced damage is a well-known issue when fabricating semiconductor devices.

The plasma induced damage can occur at various stages of the semiconductor manufacturing process, that is, at the front-end-of line (FEOL) stage, the middle-end-of line (MEOL) stage or the back-end-of line (REM) stage. In the present disclosure, the FEOL stage refers to the processes of forming features of transistors, the BEOL stage refers to the processes of forming interconnection or metallization layers over the transistors for routing the features in the transistors, and the MEOL stage refers to the processes of forming conductive contacts or vias which electrically interconnect the underlying transistors and the overlying interconnection wires formed in the interconnection layers. In some embodiments, the characteristics of the FEOL and MEOL processes provide a smaller critical dimension (CD) between elements, as compared to the BEOL processes.

In addition, as the technology advances, a dielectric layer formed in the FEOL or MEOL stage, such as the gate dielectric or the dielectric layer that separates conductive contacts, has a smaller spacing due to a reduced device size. However, the plasma induced damage occurring in the processing flow, such as during an etching of a gate (e.g., a polysilicon gate or a metal gate), during an etching of a conductive material (e.g., metals) to form conductive vias, or during plasma ashing processes used to remove photoresist, may easily damage the dielectric layer. Therefore, the present disclosure is directed to a method of releasing charges accumulating in a semiconductor structure in an earlier stage before the accumulated voltage exceeds the breakdown voltage of the dielectric layer. The proposed scheme is effective especially for charge accumulating in a deep N-well of the semiconductor structure and a semiconductor structure subject to the charge induced damage by the plasma.

FIG. 1A is a schematic cross-sectional view of a first semiconductor structure 10, in accordance with some embodiments of the present disclosure. In some embodiments, the first semiconductor structure 10 is used to build a digital-to-analog converter (DAC), an analog-to-digital converter (ADC), a phase-locked loop (PLL) circuit, a CMOS image sensor (CIS), a high-performance computing (HPC) device or a network computing device. The first semiconductor structure 10 includes a substrate 100 with a top surface S1. In some embodiments, the substrate 100 is a P-type semiconductor substrate implanted with P-type dopants such as boron (B), gallium (Ga) or indium (In) ions.

A well region 110 (referred to herein as a deep N-well (DNW) region) is disposed in the substrate 100. The DNW region 110 may be implanted with N-type dopants such as phosphorus (P) or arsenic (As) ions. In some embodiments, the DNW region 110 has a first depth D1 measured from the top surface S1 of the substrate 100. A well region 120 (e.g., an N-well region implanted with N-type dopants) is disposed within the DNW region 110. In some embodiments, the N-well region 120 has a second depth D2 measured from the top surface S1 of the substrate 100. In some embodiments, the second depth D2 is less than the first depth D1. In some embodiments, the N-well region 120 and the DNW region 110 are both semiconductive and have different levels of dopant concentrations. Another well region 122 (e.g., a P-well region implanted with P-type dopants) is disposed within the DNW region 110 and separated from the N-well region 120. In some embodiments, the P-well region 122 has a third depth D3 measured from the top surface S1 of the substrate 100. In some embodiments, the third depth D3 is less than the first depth D1. The third depth D3 may be the same as or different from the second depth D2. In some embodiments, the P-well region 122 and the substrate 100 may have different levels of dopant concentrations.

Figure 1B:
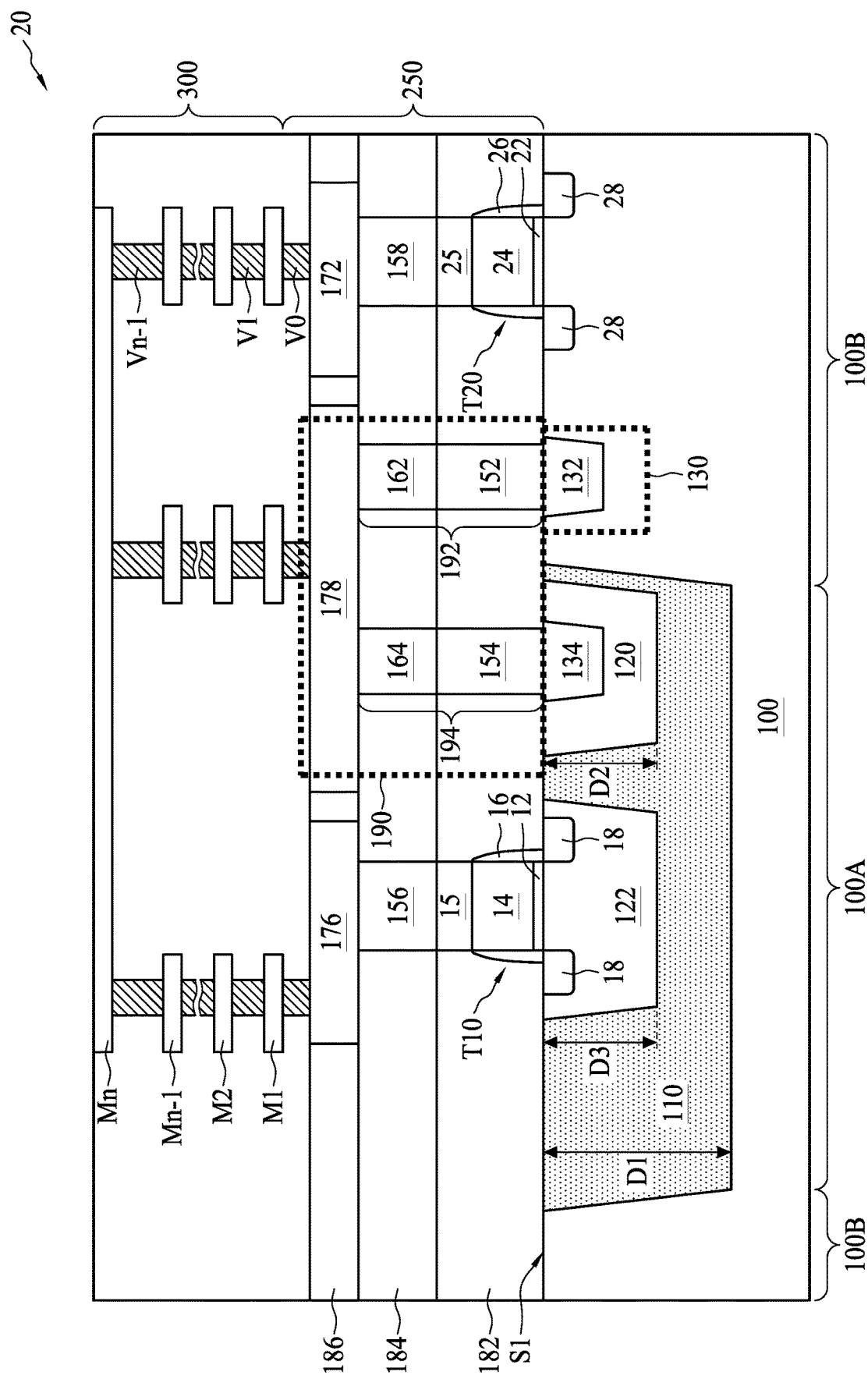
FIG. 1B is a schematic cross-sectional view of a second semiconductor structure, in accordance with some embodiments of the present disclosure.

Referring to FIGS. 1A and 1B, in some embodiments, the substrate 100 includes one or more first circuit regions 100A and one or more second circuit regions 100B. The first circuit region 100A may include the DNW region 110 and the features thereon. In some embodiments, the second circuit regions 100B are free of any DNW regions.

Doped regions 132 and 134 are disposed in the substrate 100. The doped regions 132 and 134 may be doped with appropriate dopants, such as N-type dopants. In some embodiments, the doped regions 132 and 134 are regions formed by epitaxy and doped with the appropriate dopants during the epitaxial growth of the layers. In some embodiments, the doped regions 132 and 134 are formed using ion implantation. The doped region 132 is separated from the DNW region 110 while the doped regions 134 is disposed in the DNW region 110. In embodiments where the substrate 100 is of P-type and the doped region 132 is of N-type, a P-N junction is formed at an interface between the substrate 100 and the doped region 132. In some embodiments, the doped region 132 and a portion of the substrate 100 around the doped region 132 substantially form a diode 130 in the substrate 100. In some embodiments, the diode 130 is configured to conduct charges during the manufacturing of the semiconductor structure 10 in a reverse-biased mode. In some embodiments, the diode 130 is grounded through the substrate 100. As shown in FIG. 1A, the doped region 134 is arranged in the first circuit region 100A while the doped region 132 is arranged in the second circuit region 100B. This arrangement may aid in draining the plasma induced charges from the DNW region 110 to ground of the substrate 100 through the diode 130, details of which are provided later.

An exemplary first transistor T10 and an exemplary second transistor T20 are formed in the first circuit region 100A and the second circuit region 100B, respectively. In some embodiments, the first transistor T10 is disposed in the DNW region 110 while the second transistor T20 is separated from the DNW region 110. In some embodiments, the first transistor T10 includes a gate electrode 14, a gate dielectric 12, gate spacers 16 and source/drain regions 18, Similarly, the second transistor T20 includes a gate electrode 24, a gate dielectric 22, gate spacers 26 and source/drain regions 28.

Gate electrodes 14 and 24 are disposed on the substrate 100. In some embodiments, the gate electrode 24 is separated from the DNW region 110. The gate dielectric 22 is disposed between the gate electrode 24 and the substrate 100. In some embodiments, the gate electrode 14 is disposed over the P-well region 122 surrounded by the DNW region 110. The gate dielectric 12 is disposed between the gate electrode 14 and P-well region 122. In some embodiments, the first transistor T10 and the second transistor T20 are N-type MOSFET (NMOS). In the depicted example, the transistors T10 and T20 are formed as planar-type transistors. However, the configurations of the transistors T10 and T20 are not limited thereto. Other types of the transistors T10 and 120, such as fin-type transistors or gate-all-around transistors, are also within the contemplated scope of the present disclosure.

The processing steps for forming the features discussed above may be collectively referred to as the FEOL stage. In the following, the processing steps be collectively referred to as the MEOL stage and BEOL stage, descriptions of which are provided in greater detail.

In the MEOL stage, an interconnect layer 250 is formed over the substrate 100. In some embodiments, the interconnect layer 250 includes a first interlayer dielectric (ILD) layer 182 and a second ILD layer 184 arranged over one another.

The first ILD layer 182 may include dielectric materials laterally surrounding the first transistor T10 and the second transistor 120. In some embodiments, the dielectric material of the first ILD layer 182 includes oxide, nitride, oxynitride, carbide, a combination thereof, or the like. In some embodiments, the second ILD layer 184 is formed over the first ILD layer 182. The second ILD layer 182 may include dielectric materials covering the first transistor T10 and the second transistor T20. In some embodiments, the dielectric material of the second ILD layer 184 includes oxide, nitride, oxynitride, carbide, a combination thereof, or the like.

Conductive vias 152 and 154 are disposed in the first ILD layer 182. The conductive vias 152 and 154 are respectively disposed over the doped regions 132 and 134. The conductive vias 152 and 154 may be referred to herein as metal-to-drain (MD) patterns that are used to connect doped regions in the substrate 100 to conductive layers overlying the doped regions. In some embodiments, the conductive vias 152 and 154 are respectively electrically coupled to the doped regions 132 and 134. In some embodiments, the conductive vias 152, 154 are formed of conductive materials, such as polysilicon or metallic materials, e.g., gold, silver, copper, tungsten, aluminum, titanium, tantalum, a combination thereof, or the like.

In some embodiments, conductive vias 15 and 25 are disposed in the first ILD layer 182 and in contact with the gate electrodes 14 and 24, respectively. The conductive vias 15 and 25 are referred to as gate via (VG) patterns that are used to electrically couple the gate electrodes 14 and 24 to overlying features. In some embodiments, the conductive via 15 is sandwiched between the gate electrode 14 and the conductive via 156. In some embodiments, the conductive via 25 is sandwiched between the gate electrode 24 and the conductive via 158. The conductive via 15 or 25 may have a height or width different from a height or width of the conductive via 156 or 158. In some embodiments, the conductive vias 15, 25 are formed of conductive materials, such as polysilicon or metallic materials, e.g., gold, silver, copper, tungsten, aluminum, titanium, tantalum, a combination thereof, or the like.

A conductive via 160 is disposed in the second ILD layer 184 over the conductive vias 152 and 154. The conductive via 160 may be referred to herein as a first via (VDR) pattern that extends horizontally in the second ILD layer 184 and is used to connect adjacent MD patterns underlying the second. ILD layer 184. In some embodiments, one end of the conductive via 160 is electrically coupled to the doped region 132 through the conductive via 152, and the other end of the conductive via 160 is electrically coupled to the doped region 134 through the conductive via 154.

A conductive via 156 or 158 is disposed over the conductive via 15 or 25. The conductive vias 156 or 158 may be referred to as a second via (VD) pattern that is used to connect an underlying VG pattern to a conductive layer overlying the conductive via 156 or 158. In some embodiments, the first via (VDR) pattern and the second via (VD) pattern have substantially equal heights. In some embodiments, a first direction in which the first via pattern extends is different from, e.g., orthogonal to, a second direction in which the second via pattern extends. In some embodiments, the conductive via 156 or 158 has a width different from the corresponding conductive via 15 or 25.

In some embodiments, the conductive via 152, the conductive via 154 and the conductive via 160 form a first discharge structure 150 over the substrate 100. In some embodiments, the doped region 132 is electrically coupled to the doped region 134 through the first discharge structure 150. In some embodiments, the DNW region 110 and the N-well region 120 are electrically coupled to the diode 130 through the doped region 134 and the first discharge structure 150. In some embodiments, the discharge structure 150 is arranged proximal to the boundary between the first circuit region 100A and the second circuit region 100B for achieving desired discharging performance.

In some embodiments, a total height of the gate dielectric 22, the gate electrode 24 and the conductive via 25 is substantially equal to a height of the conductive via 152 or 154. In some embodiments, a total height of the gate dielectric 12, the gate electrode 14 and the conductive via 15 is substantially equal to a height of the conductive via 152 or 154.

In the BEOL stage, a metallization layer 300 is disposed over and electrically coupled to the interconnect layer 250. The metallization layer 300 is configured to electrically interconnect the features of the substrate 100, such as the first transistor 10T and the second transistor 20T, to the overlying features, or electrically couple the features of the substrate 100 to the overlying features. The metallization layer 300 may be electrically coupled to the first discharge structure 150. The metallization layer 300 may be formed of a stack of interconnected metal line layers and metal via layers. For example, the metal line layers $M_1, \ldots M_{n-1}, M_n$ (the integer n denotes the layer index) are formed over one another and include horizontally extending metal lines. The metal via layers (the integer n denotes the layer index) are formed over one another, and a metal via layer $V_n$ is interposed between an underlying metal line layer $M_n$ and an overlying metal fine layer $W_{n+1}$ and electrically connects the metal line layer $M_n$ and $M_{n+1}$. People having ordinary skill in the art can understand that the numbers provided for the metal line layers $M_n$ and metal via layers $V_n$ described herein are not limiting. The numbers and configurations of the metallization layer 300 can be adjusted on demand according to the design requirement of the first semiconductor structure 10.

In some embodiments, the interconnect layer 250 includes a third ILD layer 186 over the second ILD layer 184, in which the third ILD layer 186 serves as a topmost layer of the interconnect layer 250. The third ILD layer 186 may include metal lines 172, 174 and 176 electrically coupled to the conductive vias 158, 160 and 156, respectively. In some embodiments, the third ILD layer 186 is regarded as a first metal line layer (e.g., metal line layer $M_0$) in the metallization layer 300. The metal line 174 may be electrically coupled to the doped region 132 or the doped region 134 through the first discharge structure 150. The third ILD layer 186 may separate and electrically isolate the metal lines 172, 174 and 176.

FIG. 1B is a schematic cross-sectional view of a second semiconductor structure 20, in accordance with some embodiments of the present disclosure. The second semiconductor structure 20 is similar to the first semiconductor structure 10 in many aspects, and descriptions of the similar features are omitted for brevity. The second semiconductor structure 20 is different from the first semiconductor structure 10 in that the second semiconductor structure 20 includes a second discharge structure 190 instead of the first discharge structure 150.

The second discharge structure 190 is disposed over the substrate 100. In some embodiments, the second discharge structure 190 includes a conductive member 192 disposed over the doped region 132, a conductive member 194 disposed over the doped region 134, in which the metal line 172 is disposed over the conductive members 192 and 194. The conductive member 192 includes the conductive via 152 and a conductive via 162 disposed over the conductive via 152. The conductive member 194 includes the conductive via 154 and a conductive via 164 disposed over the conductive via 154. The conductive vias 162 and 164 are formed in the second ILD layer 184 in the same level of the conductive via 160 shown in FIG. 1A. In some embodiments, a total height of the conductive via 152 and the conductive via 162 is substantially equal to a total height of the conductive via 154 and the conductive via 164. In some embodiments, the conductive vias 152 and 162 have different widths, and the conductive vias 154 and 164 have different widths, and thus the conductive member 192 or 194 has sidewalls including a step at the interface between the first ILD layer 182 and the second ILD layer 184.

In some embodiments, the conductive members 192 and 194 are respectively electrically coupled to the doped regions 132 and 134. The metal line 178 may connect the conductive member 192 to the conductive member 194. In some embodiments, one end of the metal line 178 is electrically coupled to the doped region 132 through the conductive member 192, and the other end of the metal line 178 is electrically coupled to the doped region 134 through the conductive member 194. In some embodiments, the doped region 132 is electrically coupled to the doped region 134 through the second discharge structure 190. In such embodiments, the DNW region 110 and the N-well region 120 are electrically coupled to the diode 130 via the doped region 134 and the second discharge structure 190. In some embodiments, the discharge structure 190 is arranged proximal to the boundary between the first circuit region 100A and the second circuit region 100B for achieving desired discharging performance.

Figure 2:
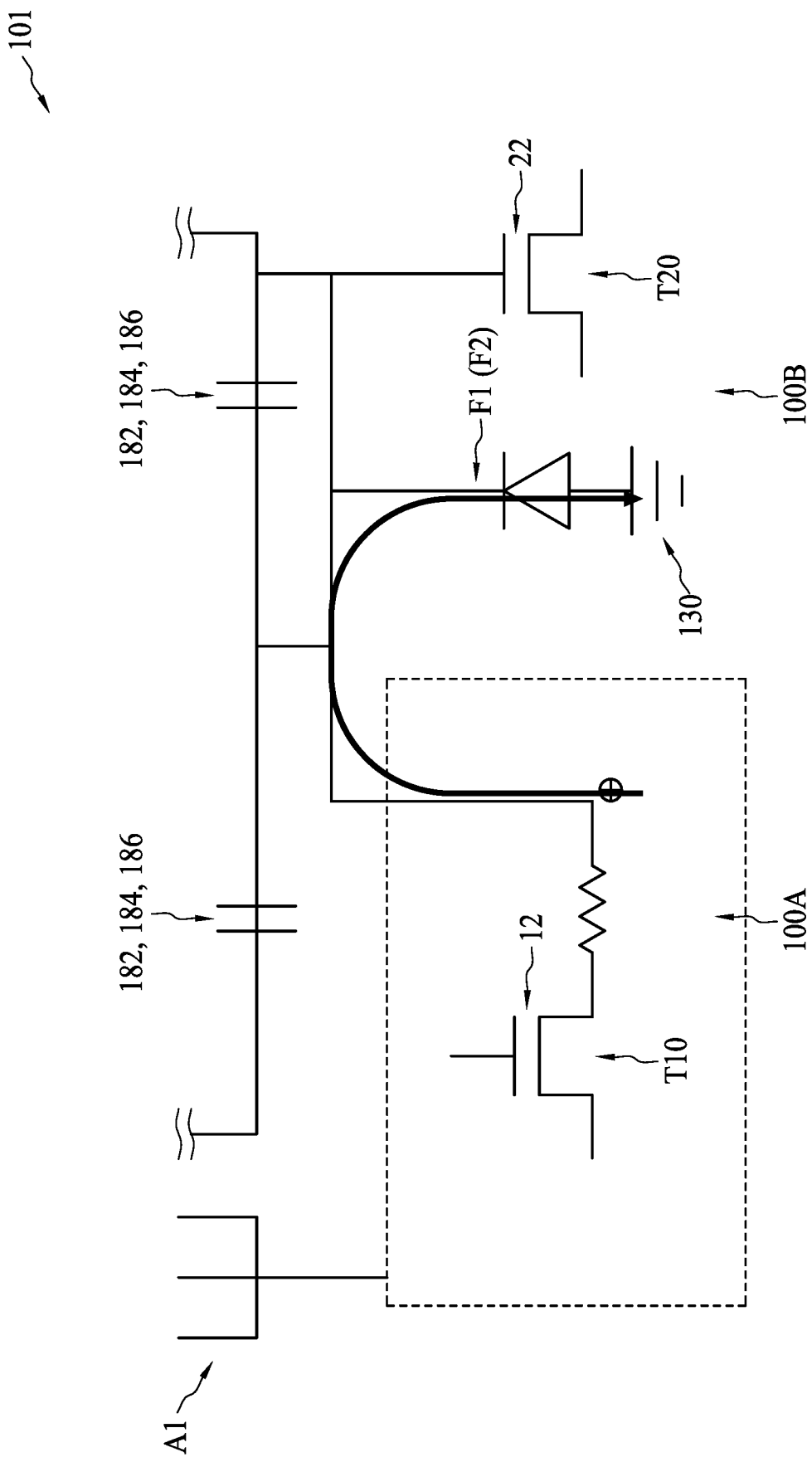
FIG. 2 is a schematic diagram representing a circuit of the first semiconductor structure shown in FIG. 1A or the second semiconductor structure shown in FIG. 1B, in accordance with some embodiments of the present disclosure.

FIG. 2 is a schematic diagram representing a circuit representation 101 of the first semiconductor structure 10 shown in FIG. 1A or the second semiconductor structure 20 shown in FIG. 1B, in accordance with some embodiments of the present disclosure. During a semiconductor manufacturing process, various operations such as reactive-ion etching (RIE), plasma-enhanced chemical vapor deposition (PECVD) or plasma-enhanced atomic layer deposition (PEALD) may produce charges and leave them in the incomplete integrated circuit. The effect of charge accumulation in isolated features of the integrated circuit during the manufacturing process is known as antenna effect, as represented by the antenna symbol A1. Referring to FIG. 2, in the circuit 101, the first transistor T10 is disposed in the first circuit region 100A and the second transistor T20 is disposed in the second circuit region 100B. According to the present disclosure, a discharge path F1 or F2 is established between the first circuit region 100A and the second circuit region 100B. The discharge path F1 includes a diode 130 that is grounded. As a result, charges accumulating in the first circuit region 100A can be drained to ground through the diode 130 in the second circuit region 100B. The flow of the charges moves along the discharge path F1 toward the diode 130 instead of toward the dielectric layers such as the gate dielectrics 12 and 22 or the ILD layers 182, 184 and 186. As a result, the dielectric layers in the circuit 101 can be protected from plasma induced damage with help of the discharge path.

Figure 3:
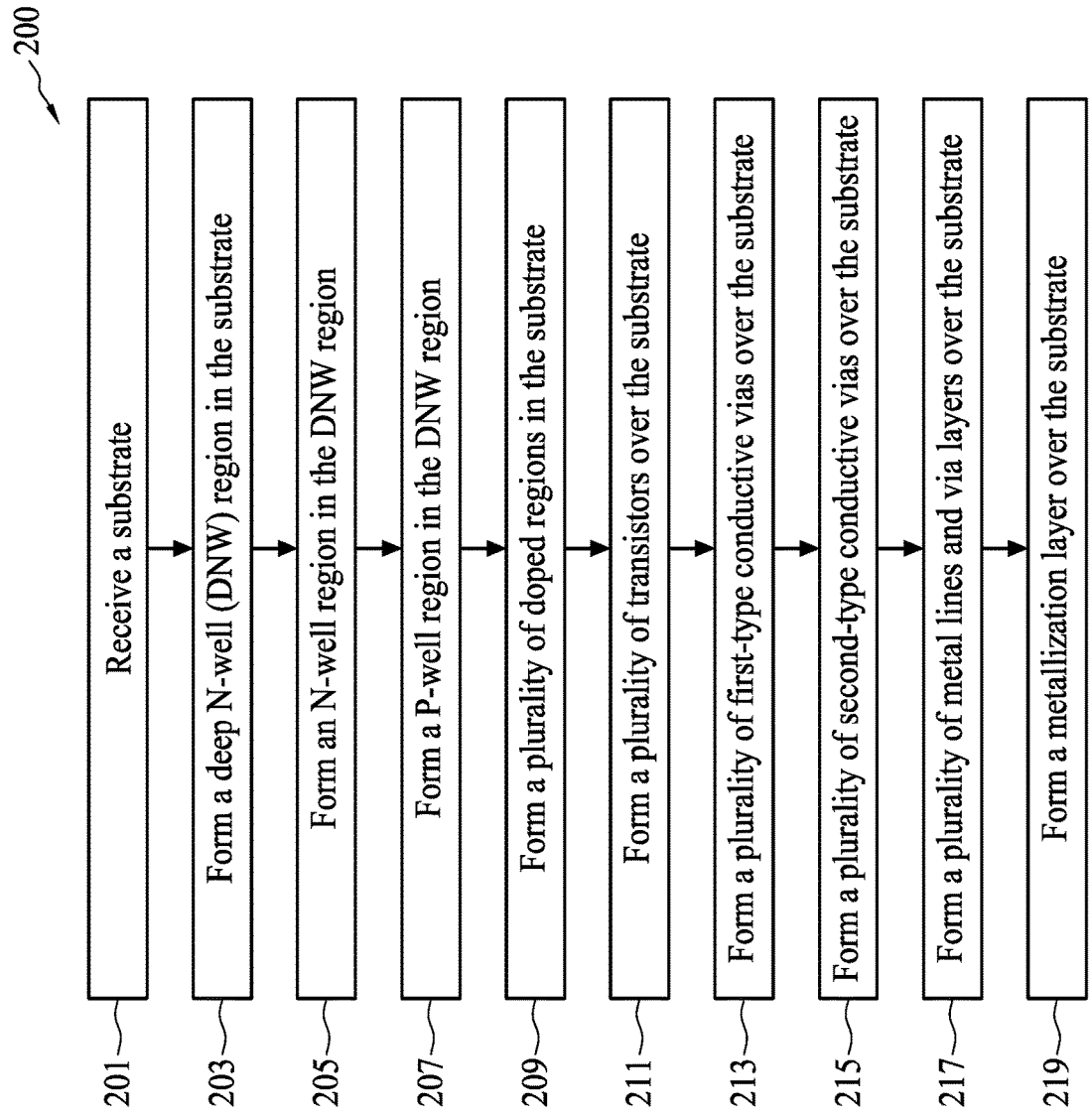
FIG. 3 is a flow diagram showing a method of fabricating a semiconductor structure, in accordance with some embodiments of the present disclosure.

FIG. 3 is a flow diagram showing a method 200 of fabricating a semiconductor structure, in accordance with some embodiments of the present disclosure. FIGS. 4 to 24 are schematic cross-sectional views illustrating sequential operations of the method 200 shown in FIG. 3, in accordance with some embodiments of the present disclosure.

Figure 4:
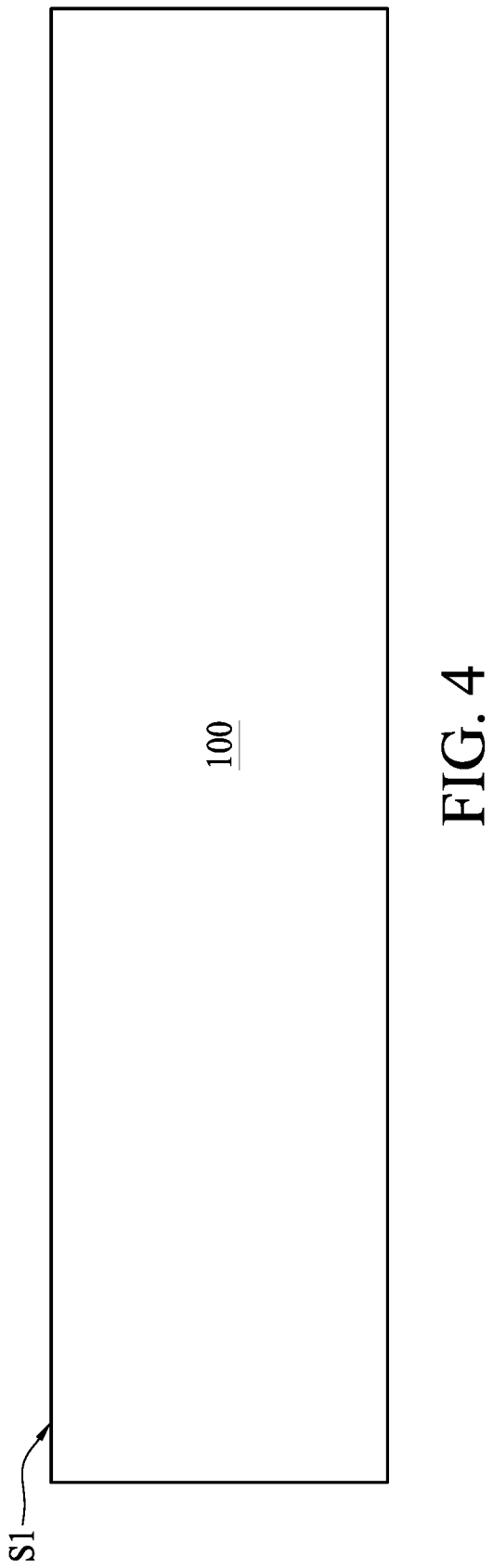
FIGS. 4 to 29 are schematic cross-sectional views illustrating sequential operations of the method shown in FIG. 3, in accordance with some embodiments of the present disclosure.

In some embodiments, operations 201 to 211 of FIG. 3 are collectively referred to as the FEOL stage. Referring to operation 201 of FIG. 3, a substrate 100 is provided, as shown in FIG. 4. The substrate 100 has a top surface S1. In some embodiments, the substrate 100 includes a bulk material, e.g., bulk silicon. In some embodiments, the substrate 100 is a P-type semiconductive substrate doped with P-type dopants, such as boron (B), gallium (Ga), indium (In), or the like. In some other embodiments, the substrate 100 includes other semiconductor materials, such as silicon germanium (SiGe), silicon carbide (SiC), gallium arsenide (GaAs), or the like. In some embodiments, the substrate 100 includes a first circuit region 100A and a second circuit region 100B adjacent to the first circuit region 100A.

Figure 5:
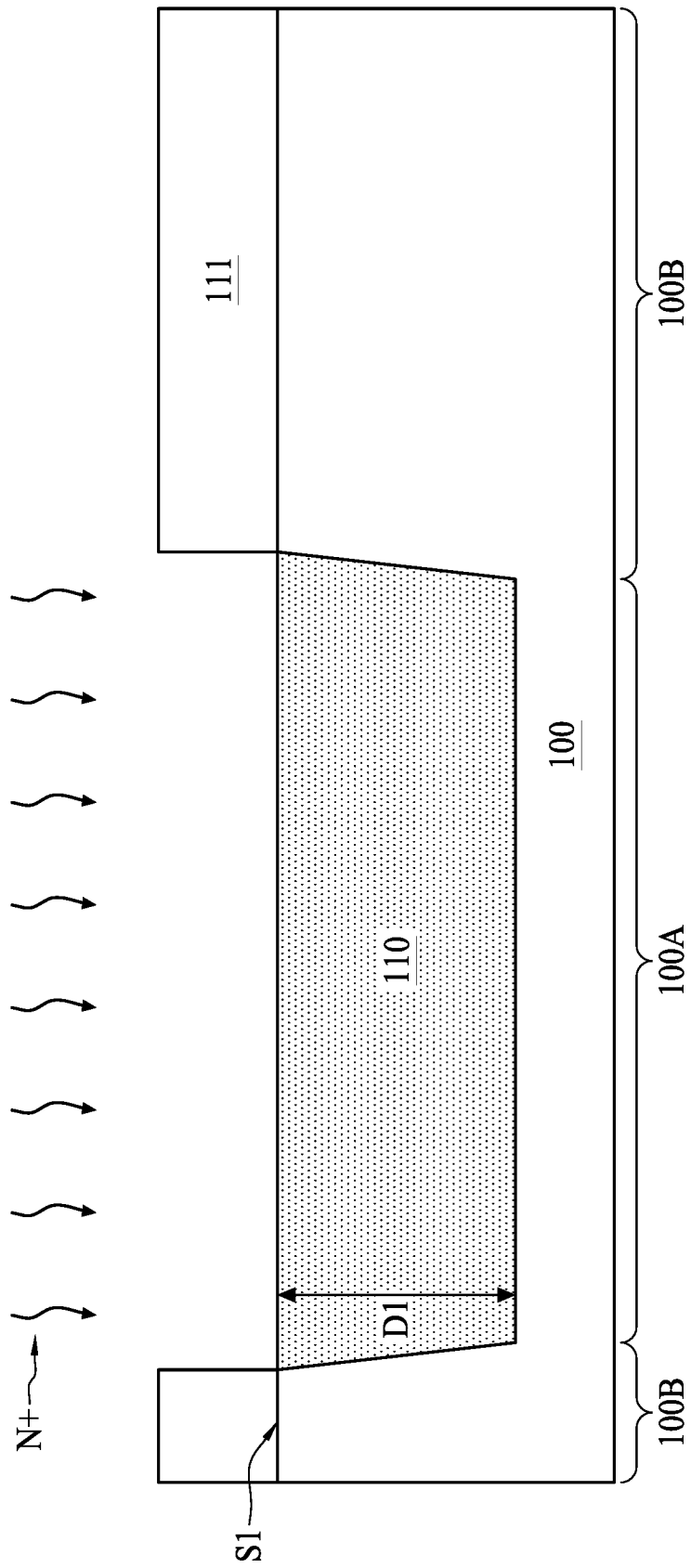

Referring to operation 203 of FIG. 3, a well region 110, e.g., a deep N-well (DNW) region, is formed in the substrate 100, as shown in FIG. 5. In some embodiments, the DNW region 110 is formed by initially forming an implantation mask 111 to cover the second circuit region 100B, followed by implanting N-type dopants such as phosphorus (P) or arsenic (As) ions into the first circuit region 100A of the substrate 100. The N-type dopants may be implanted to a first depth D1 starting from the top surface S1 of the substrate 100. The second circuit region 100B, which is not implanted, may be referred to as a non-deep N-well region. The implantation mask 111 may be removed or stripped after the DNW region 110 is formed.

Figure 6:
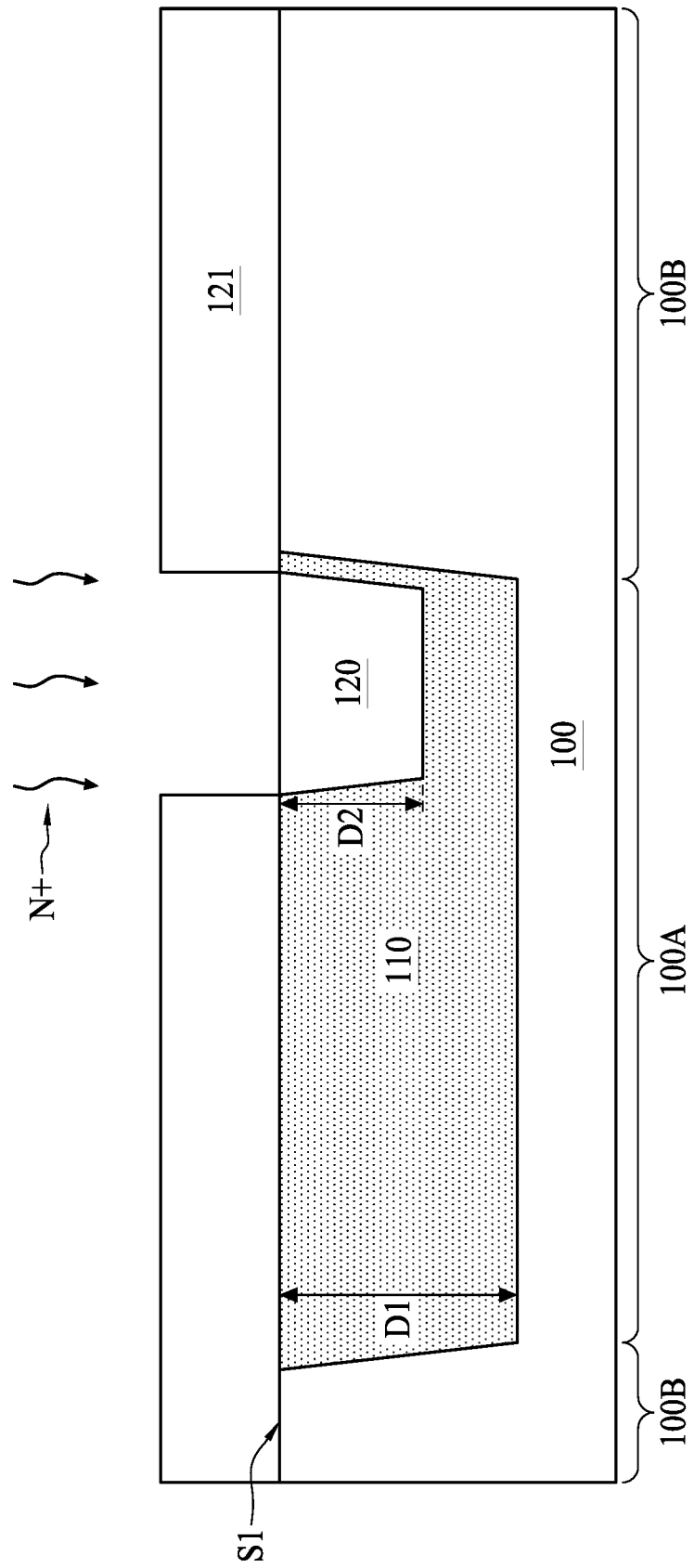

Referring to operation 205 of FIG. 3, a well region 120, e.g., an N-well region, is formed in the DNW region 110, as shown in FIG. 6. An implantation operation may be performed on the substrate 100 with a portion of the DNW region 110 exposed through an implantation mask 121. The N-well region 120 may be formed by implanting another round of N-type dopants into the exposed portion of the DNW region 110 exposed by the implantation mask 121. In some embodiments, the dopant concentration level used to form the N-well region 120 is different from the dopant concentration level used to form the DNW region 110. The N-well region 120 may have a second depth D2 measured from the top surface S1 of the substrate 100. In some embodiments, the second depth D2 is less than the first depth D1. The implantation mask 121 may be removed or stripped after the well region 120 is formed.

Figure 7:
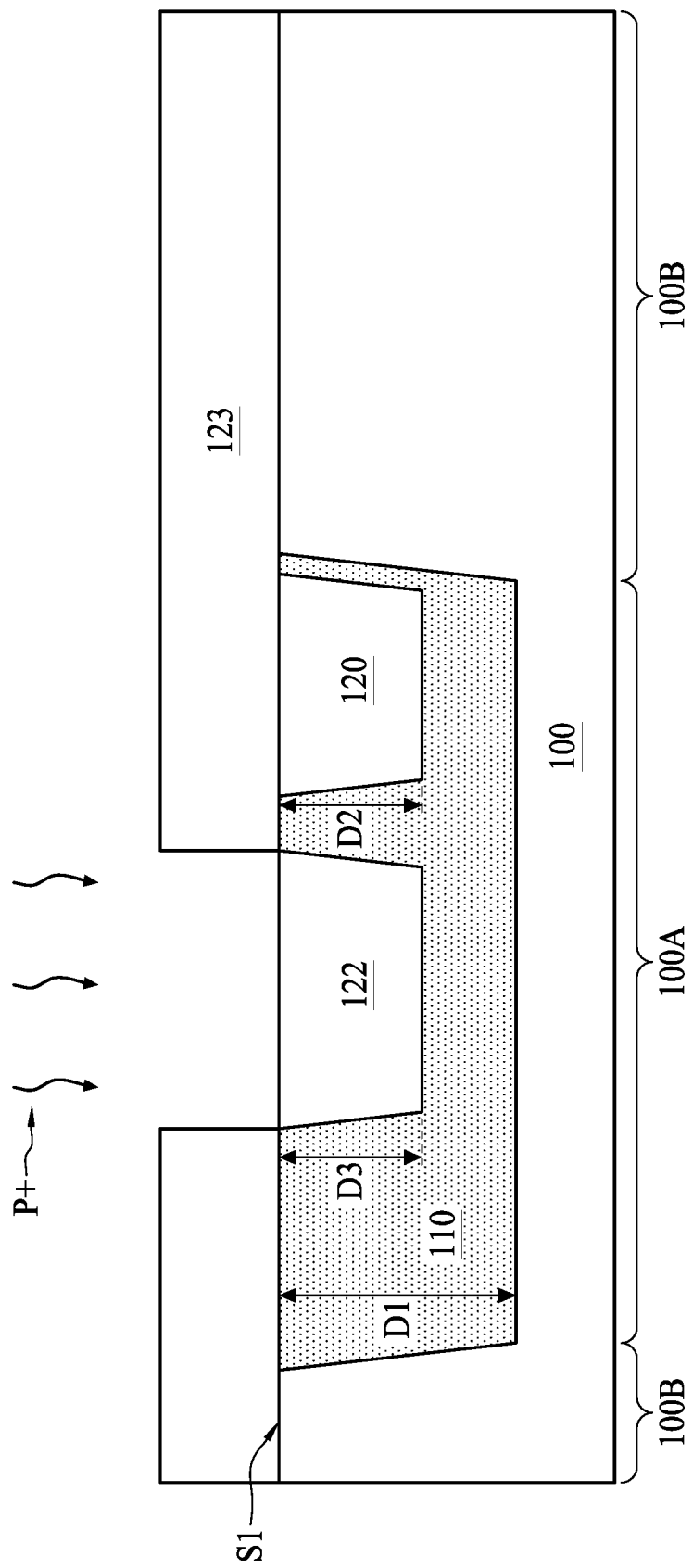

In operation 207 of FIG. 3, a P-well region 122 is formed in the DNW region 110, as shown in FIG. 7. An implantation operation may be performed on the substrate 100 with a portion of the DNW region 110 exposed through an implantation mask 123. The P-well region 122 may be formed by implanting P-type dopants into the exposed portion of the DNW region 110 exposed through the implantation mask 123. In some embodiments, the P-well region 122 is separated from the N-well region 120. In some embodiments, the dopant concentration level used to form the P-well region 122 is different the dopant concentration level used to form the P-type substrate 100. The P-well region 122 may have a depth D3 measured from the top surface S1 of the substrate 100. In some embodiments, the third depth D3 is less than the first depth D1. The second depth D2 and the third depth D3 may be the same or different. The implantation mask 123 may be removed or stripped after the P-well region 122 is formed.

Figure 8:
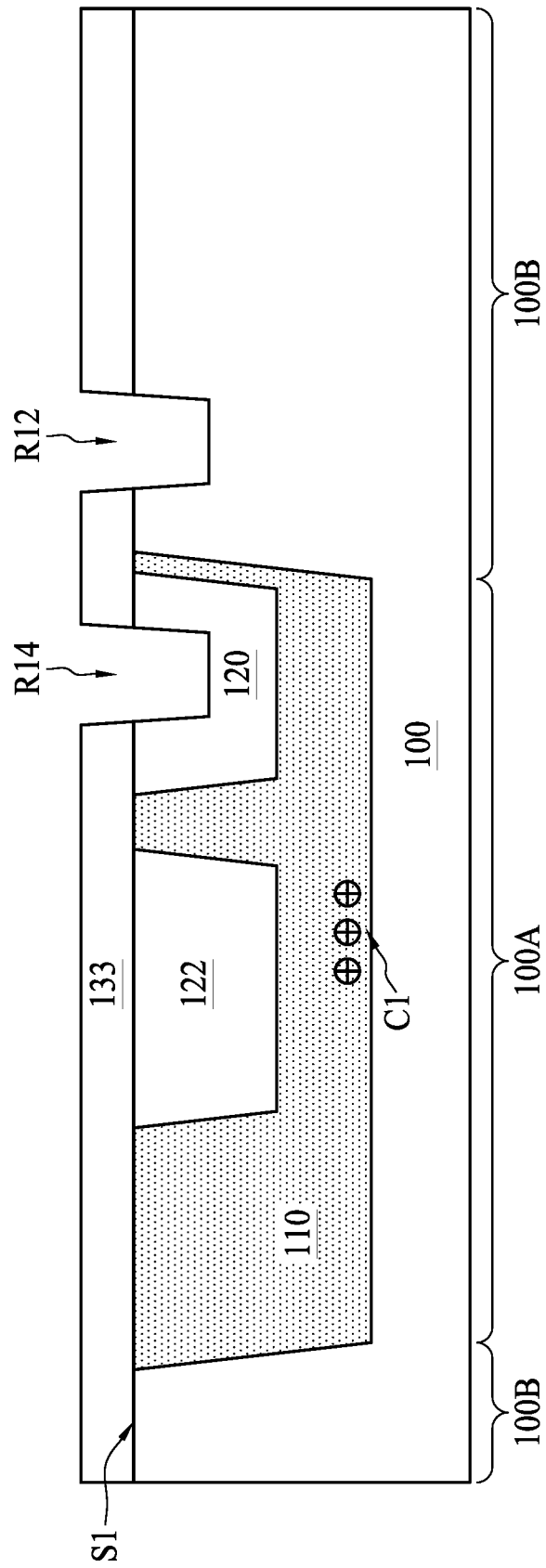
Figure 9:
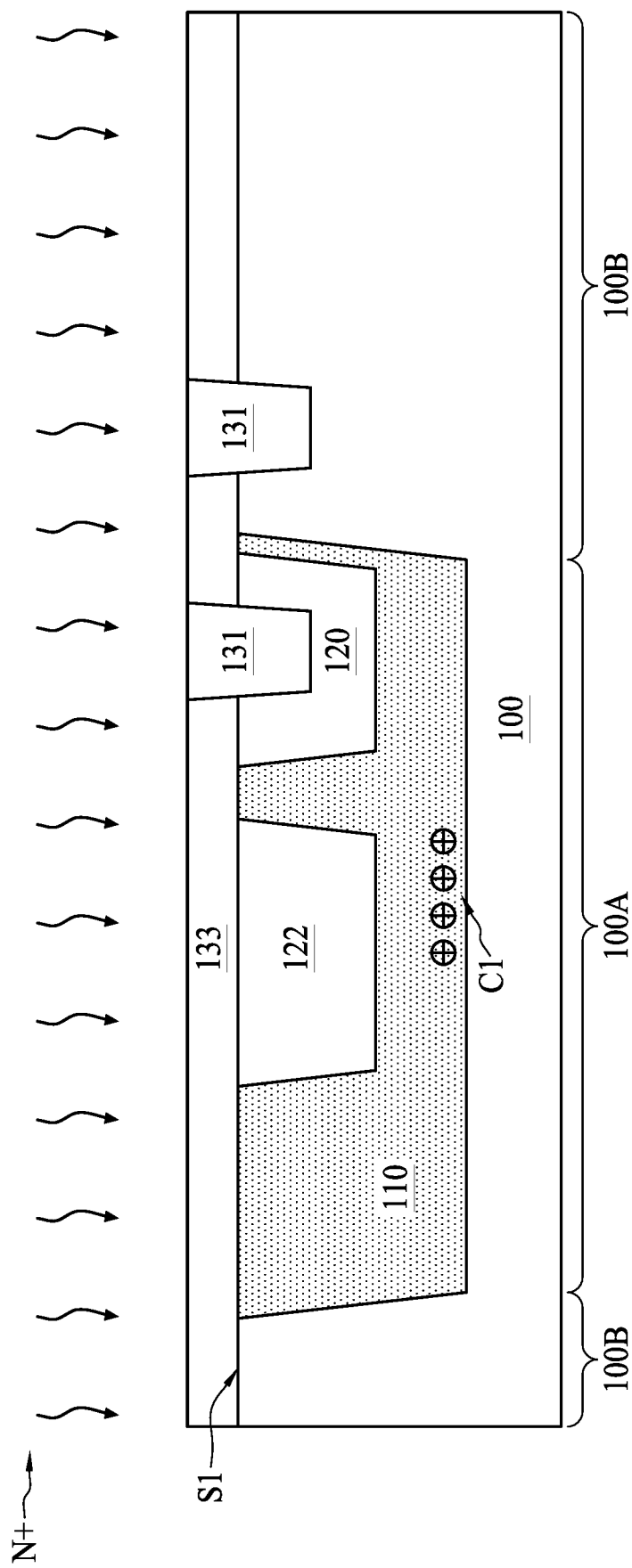
Figure 10:
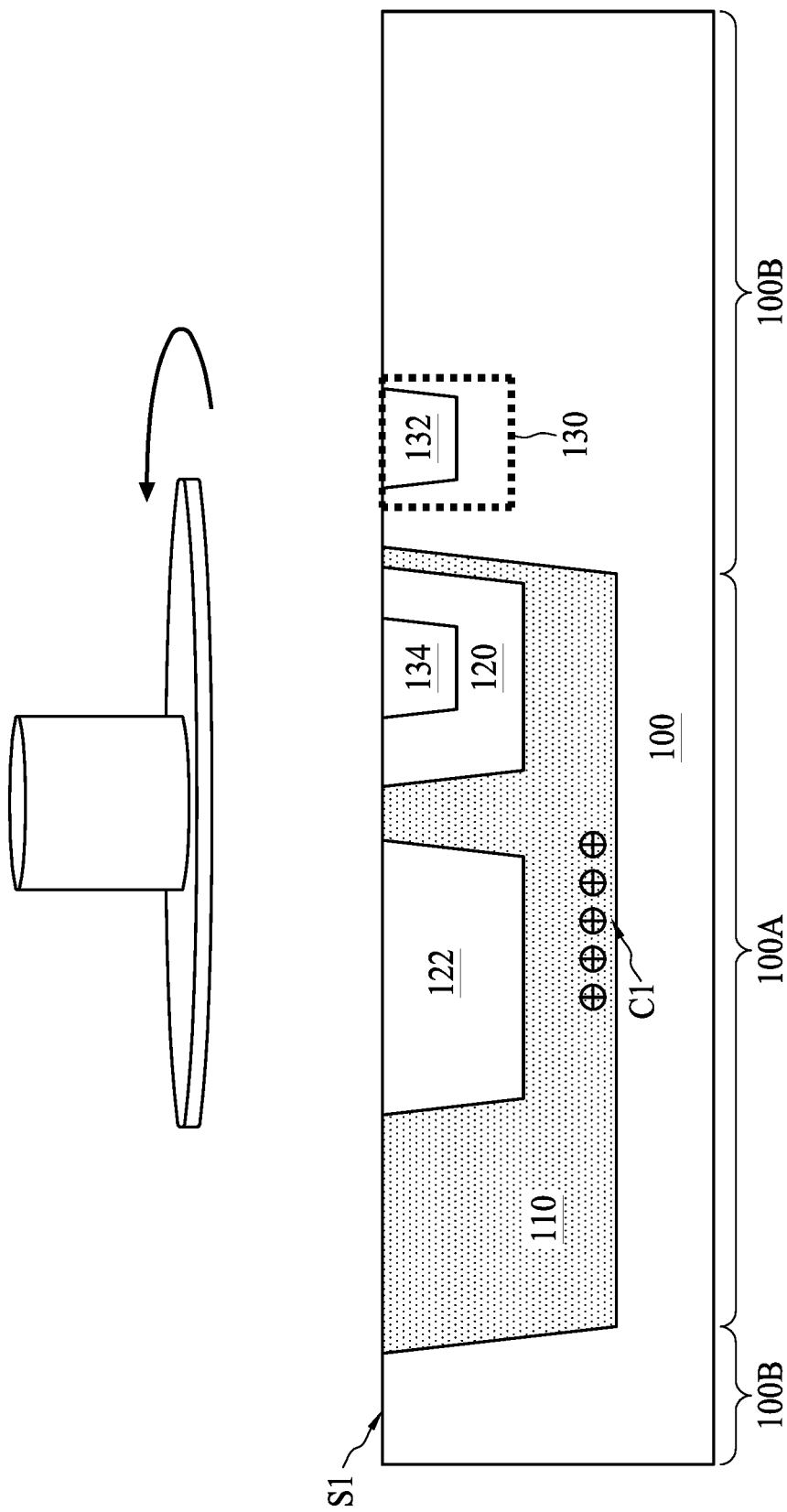

Referring to operation 209, a plurality of doped regions are formed in the substrate 100, as shown in FIGS. 8 to 10. In some embodiments, the doped regions may be formed by epitaxial growth or ion implantation performed on the substrate 100, Referring to FIG. 8, as an example of epitaxial growth of the doped regions, recesses R12 and R14 are formed in the substrate 100 by etching portions of the substrate 100 from the top surface S1. In some embodiments, a patterned mask layer 133 is formed for etching the recesses R12 and R14. The recess R12 is formed in the second circuit region 100B while the recesses R14 is formed in the first circuit region 100A, e.g., the DNW region 110. In some embodiments, the recess R14 is formed in the N-well region 120 of the DNW region 110. In some embodiments, the etching includes dry etch, a wet etch, a combination thereof (e.g., reactive ion etch), or the like. In order to improve the etching performance, one or more of the various etching methods are performed with involvement of a plasma. During the plasma-enhanced etching operation, charges C1 may be produced due to the use of high-voltage ions. In some embodiments, the charges C1 include positive charges. In some embodiments, the charges C1 accumulate in the DNW region 110. When the accumulating charges C1 generate a positive voltage potential over the doped region 132, the diode 130 may be operated in a reverse-biased mode. In some embodiments, when the positive voltage potential is greater than the avalanche breakdown voltage of the diode 130, the diode 130 conducts and drains the charges C1 from the DNW region 110 to the substrate 100.

Referring to FIG. 9, an epitaxial growth operation, such as molecular-beam epitaxy (MBE), vapor-phase epitaxy (VPE), liquid-phase epitaxy (LPE), or the like, may be performed to form epitaxial layers 131 in the recesses R12 and R14. In some embodiments, the forming of the epitaxial layers 131 includes doping of N-type dopants. The epitaxial layers 131 may be grown in the recesses R12 and R14 from the surface of the substrate 100. In some embodiments, the epitaxial layers 131 are grown to a raised epitaxial layer 131 with an upper surface higher than the top surface S1 of the substrate 100. The patterned mask layer 133 may be removed or stripped after a predetermined thickness of the epitaxial layer 131 is formed. The epitaxial growth operation may be performed by a plasma-enhanced operation, whereby more charges C1 accumulate in the DNW region 110.

Referring to FIG. 10, a planarization operation, such as chemical mechanical planarization (CMP), may be performed to level the surface of the epitaxial layers 131. After excess epitaxial layer 131 over the top surface S1 are removed, doped regions 132 and 134 are formed in the substrate 100. In some embodiments, the doped regions 132 and 134 extend downward to certain depths of the substrate 100. The doped region 132 is formed in the second circuit region 100B while the doped region 134 is formed in the first circuit region 100A, e.g., the DNW region 110. In some embodiments, the doped regions 132 and 134 include N-type dopants. The planarization operation may be performed by a plasma-enhanced operation, whereby more charges C1 accumulate in the DNW region 110.

Figure 11:
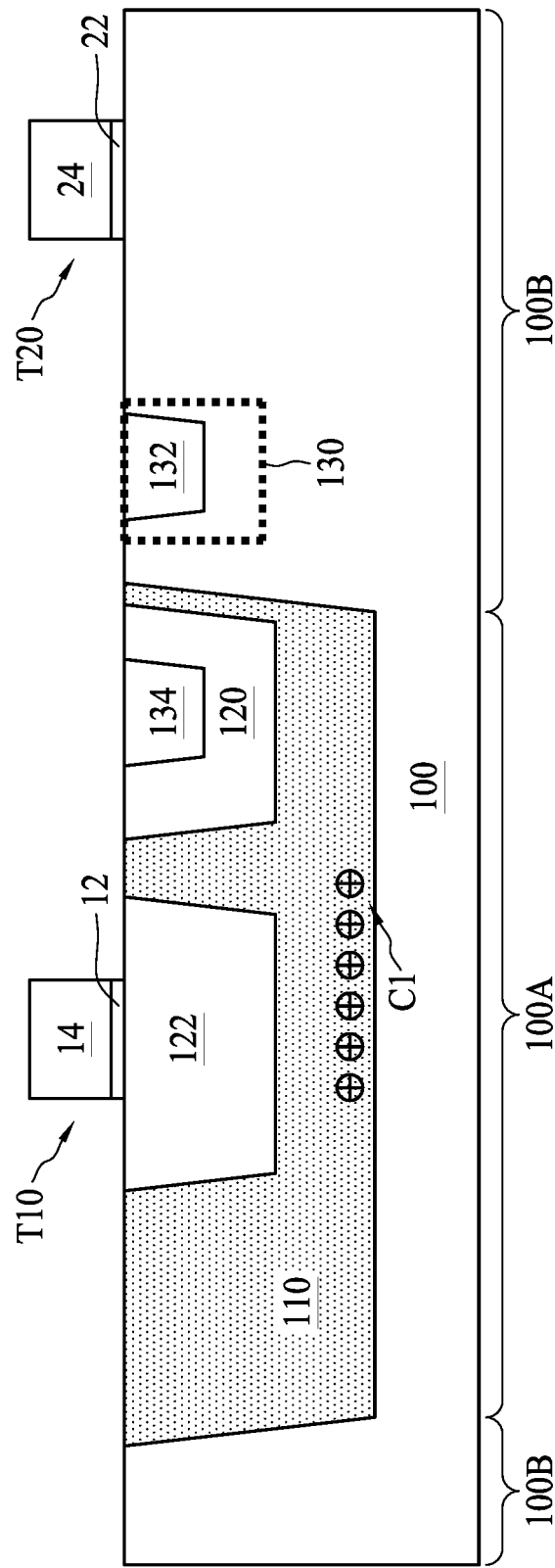
Figure 12:
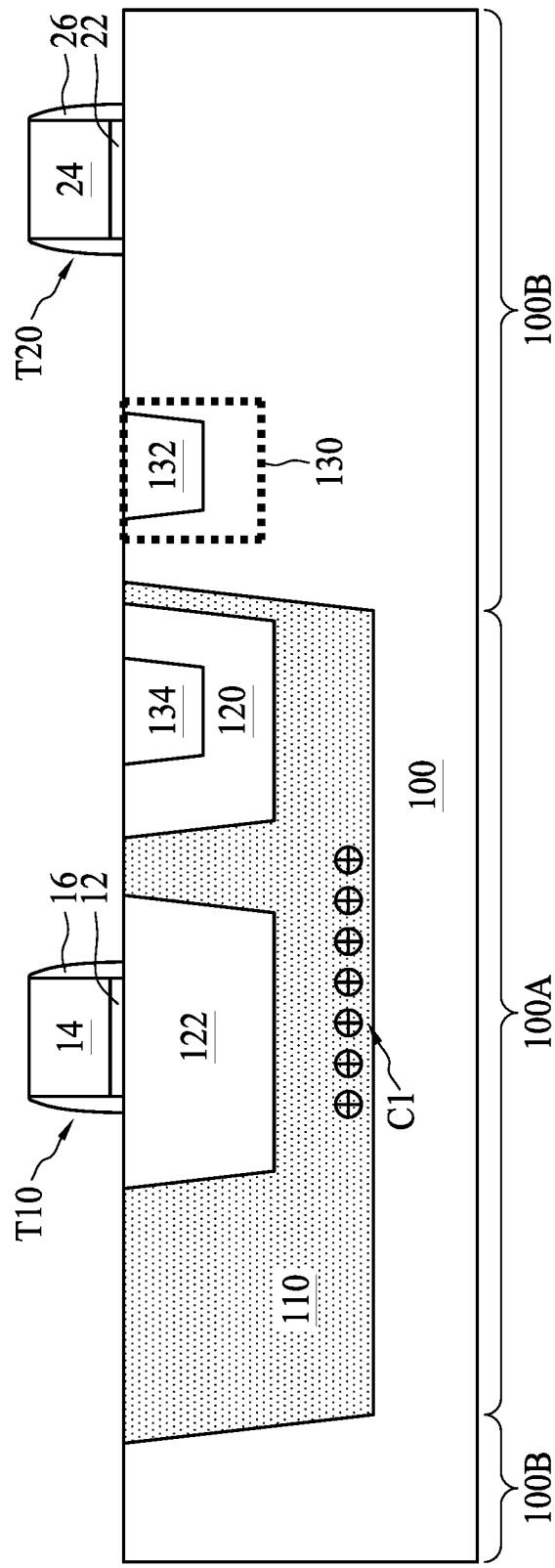
Figure 13:
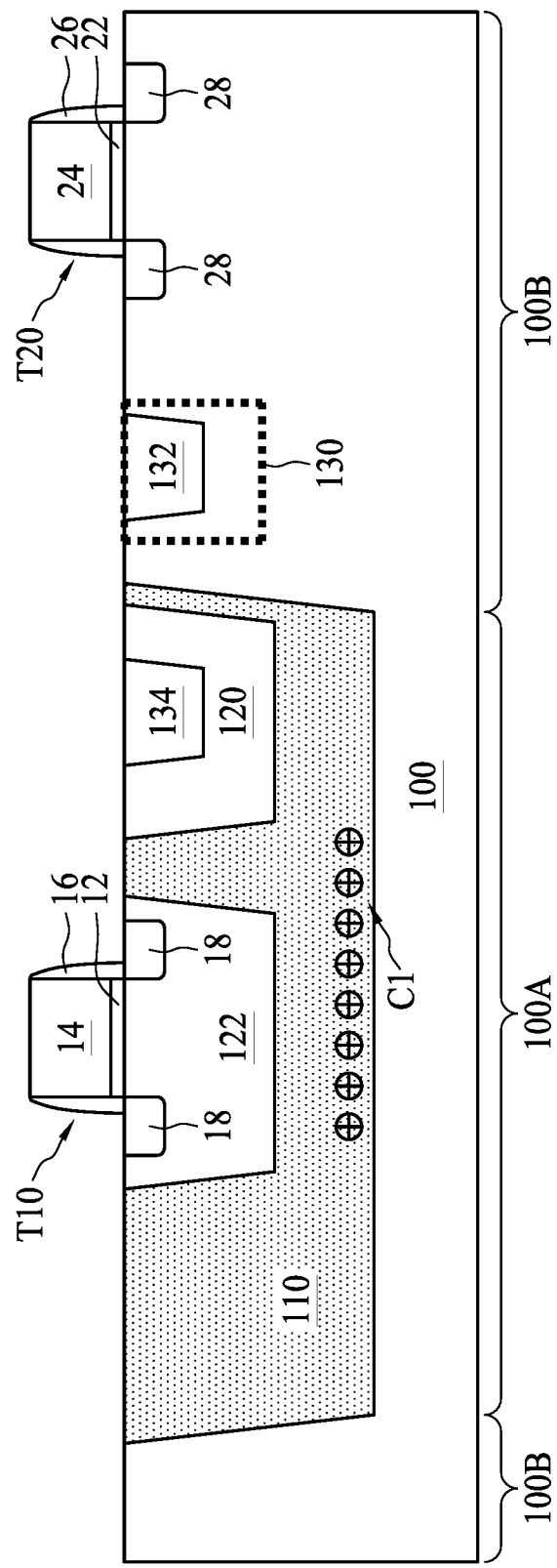

Referring to operation 211 of FIG. 3, a plurality of exemplary transistors are formed over the substrate 100, as shown in FIGS. 11 to 13. Referring to FIG. 11, a first transistor layer T1 and a second transistor layer T2 are respectively formed over the first circuit region 100A and the second circuit region 100B. In some embodiments, the first transistor layer T10 includes a gate dielectric 12 formed over the P-well region 122 and a gate electrode 14 formed over the gate dielectric 12. In some embodiments, the second transistor layer T20 includes a gate dielectric 22 formed over the P-type substrate 100 and a gate electrode 24 formed over the gate dielectric 22. The gate dielectrics 12, 22 and the gate electrodes 14, 24 may be formed using deposition and patterning operations, in which the deposition operation may include chemical vapor deposition (CVD), physical vapor deposition (PVD), atomic layer deposition (ALD), combinations thereof, or the like. The patterning operation may include a dry etch, a wet etch, an RIE, or the like. In some embodiments, the deposition or etching operations may be enhanced by help of a plasma. These plasma-enhanced operations may produce more charges C1 accumulating in the DNW region 110.

The gate dielectric 12 and the gate electrode 14 may be formed by depositing suitable materials in sequence using deposition method in a blanket manner, followed by a patterning operation to form the first transistor layer T10. The gate dielectric 12 and the gate electrode 14 may be formed by depositing suitable materials in sequence using deposition method in a blanket manner, followed by a patterning operation to form the second transistor layer 120. The gate dielectrics 12, 22 may be formed of one or more dielectric materials, such as oxide, nitride, oxynitride, or high-k dielectric materials, such as $Al_2O_3$, $HfO_2$, $ZrO_2$, $HfO_xN_y$, $ZrO_xN_y$, $HfSi_xO_y$, $ZrSi_xO_y$, $HfSi_xO_yN_z$, $ZrSi_xO_yN_z$, $TiO_2$, $Ta_2O_5$, $La_2O_3$, $CeO_2$, $WO_3$, $Y_2O_3$, $LaAlO_3$, $Bal-xSr_xTiO_3$, $PbTiO_3$, $BaTiO_3$ (BTO), $SrTiO_3$ (STO), $BaSrTiO_3$ (BST), $PbZrO_3$, lead-strontium-titanate (PST), lead-zinc-niobate (PZN), lead-zirconate-titanate (PZT), lead-magnesium-niobium (PMN), yttria-stabilized zirconia (YSZ), ZnO/Ag/ZnO (ZAZ), a combination thereof, or the like. The gate electrodes 14, 24 may be formed of polysilicon or metallic materials such as tungsten (W), copper (Cu), cobalt (Co), aluminum (Al), nickel (Ni), tantalum (Ta), titanium (Ti), molybdenum (Mo), palladium (Pd), platinum (Pt), ruthenium (Ru), iridium (Ir) silver (Ag), gold (Au), titanium nitride (TiN), tantalum nitride (TaN), a combination thereof, or the like. The patterning operation may be performed by a plasma-enhanced operation, whereby more charges C1 accumulate in the DNW region 110.

Referring to FIG. 12, gate spacers 16 and 26 are respectively formed on sidewalls of the first transistor layer T10 and the second transistor layer 120. The gate spacers 16, 26 may be formed of dielectric materials, such as oxide, nitride, oxynitride, carbide, a combination thereof, or the like.

Referring to FIG. 13, source/drain regions 18 are formed on two sides of the gate electrode 14 and the gate spacers 16, and source/drain regions 28 are formed on two sides of the gate electrode 24 and the gate spacers 26. The source/drain regions 18 may be formed by implanting N-type dopants into a portion of the P-well region 122. The source/drain regions 28 may be formed by implanting N-type dopants into a portion of the substrate 100. An implantation mask (not shown) may be used during the formation of the source/drain regions 18 and 28. In some embodiments, the gate spacers 16, 26 are used as an implantation mask of the source/drain regions 18 and 28, respectively. The formation of the source/drain regions 18 may include a plasma-enhanced operation, whereby more charges C1 accumulate in the DNW region 110.

After the formation of the source/drain regions 18, 28, a first transistor T10 and a second transistor T20 are completed. In some embodiments, the first transistor T10 or the second transistor T20 is a field-effect transistor (FET) device, which can be implemented using a planar-type FET device, a fin-type FET device, a nanosheet FET device, a nanowire FET device, or other suitable FET technologies. Although the present embodiment illustrates the formation of N-type transistors, such as the first transistor T10 and the second transistor T20, the present disclosure is not limited thereto. In some embodiments, the charges C1 accumulating in the DNW region 110 establish a voltage potential less than a breakdown voltage of the gate dielectric 12 of the first transistor T10 prior to the forming of the diode 130.

Figure 14:
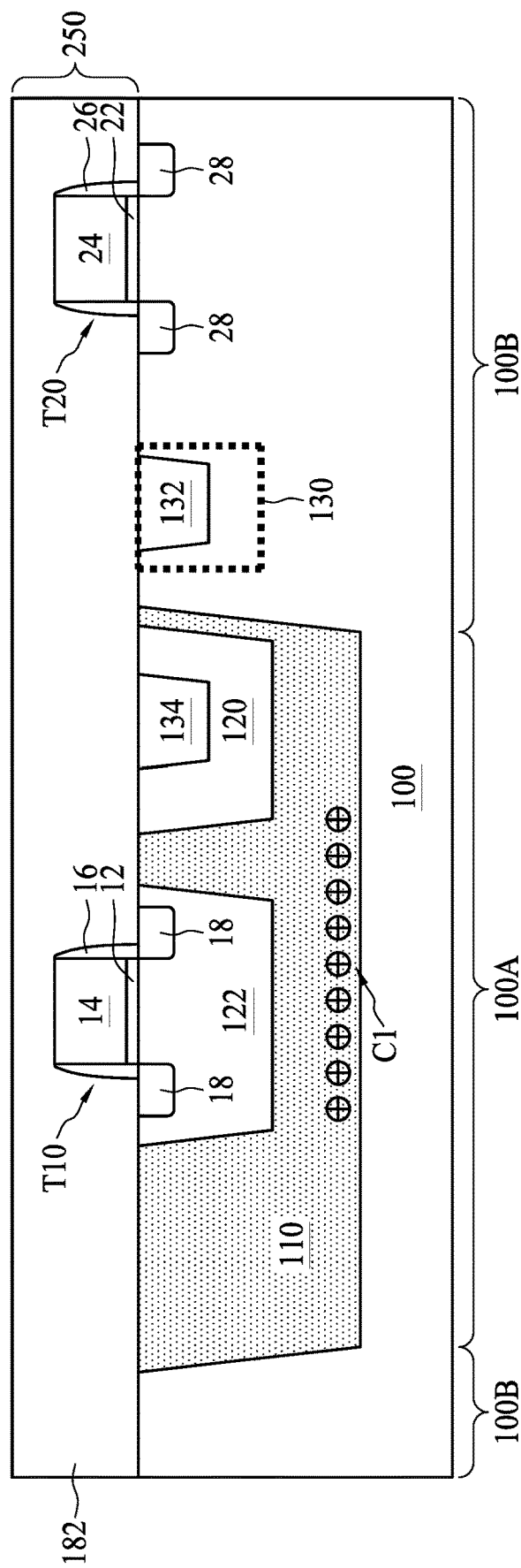
Figure 15:
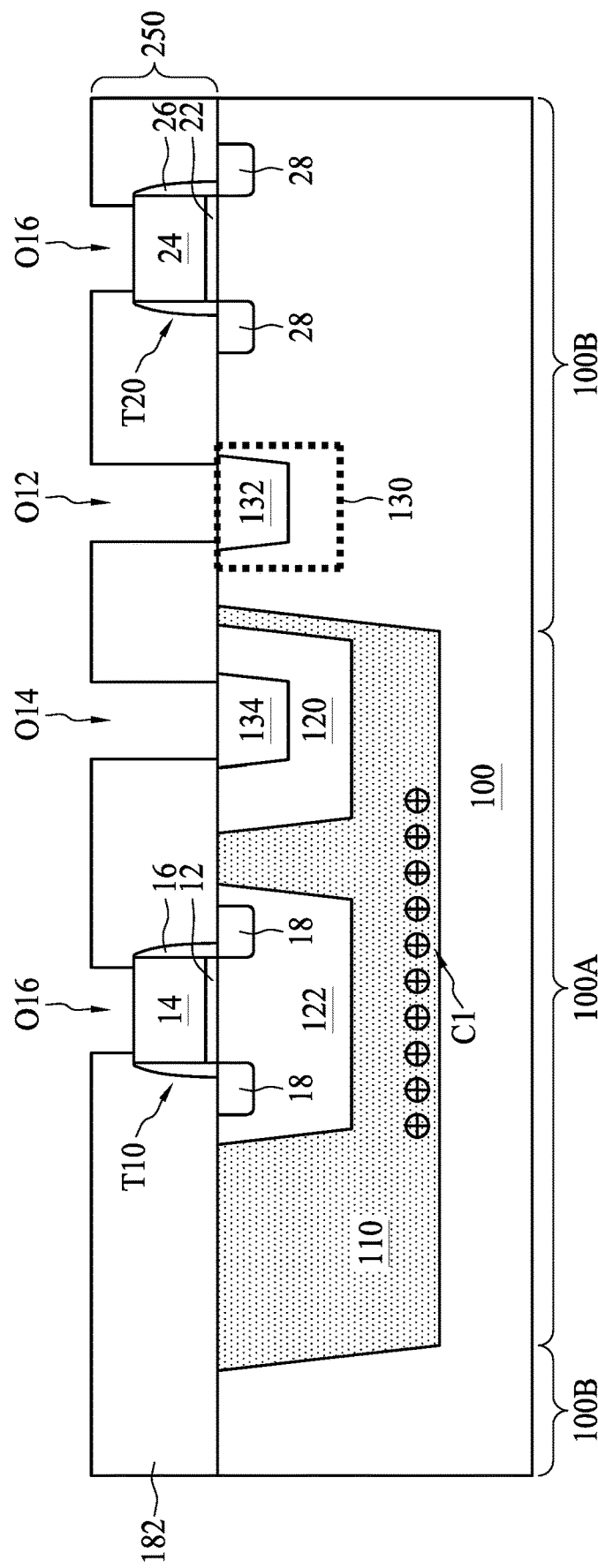
Figure 16:
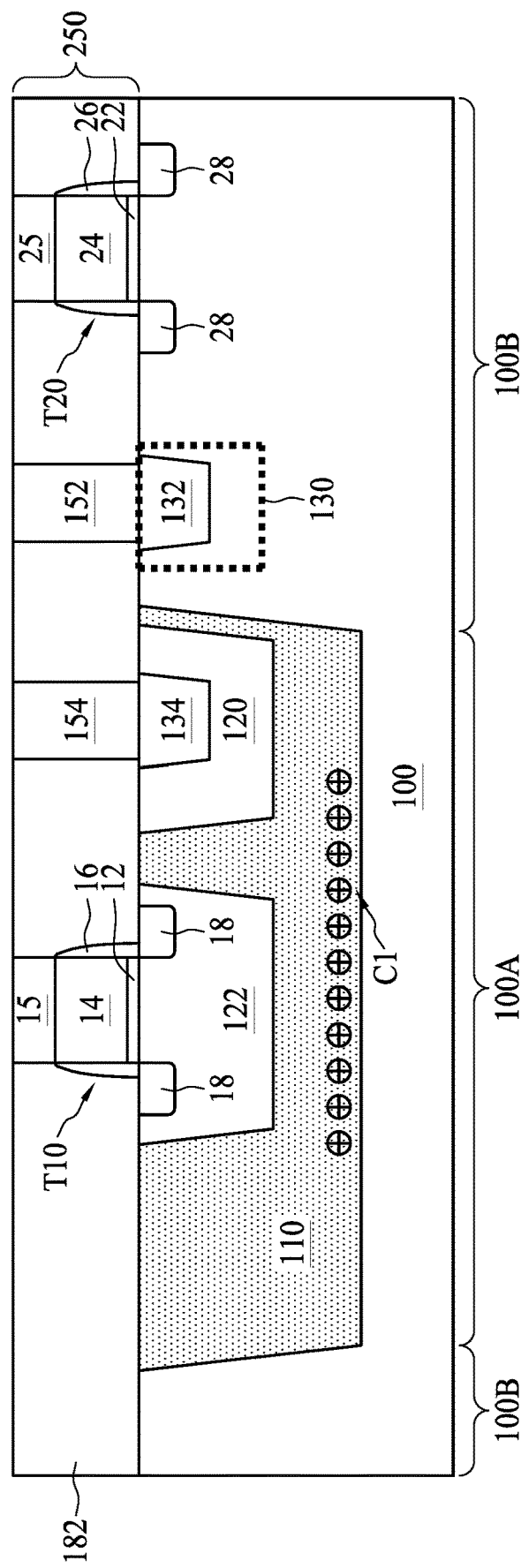

In some embodiments, operations 213 to 217 of FIG. 3 are collectively referred to as the MEOL stage. Referring to operation 213 of FIG. 3, a plurality of first-type conductive vias are formed over the substrate 100, as shown in FIGS. 14 to 16. Referring to FIG. 14, an interconnect layer 250 is formed. Initially, a first interlayer dielectric (ILD) layer 182 is formed over the first circuit region 100A and the second circuit region 100B. The first ILD layer 182 may cover and laterally surround the first transistor T10 and the second transistor T20. The first ILD layer 182 may be formed of oxide, such as un-doped silicate glass (USG), fluorinated silicate glass (FSG), silicon oxide, silicon nitride, silicon oxynitride, low-k dielectric materials, or the like. The low-k dielectric materials may have k values lower than 3.8, although the dielectric materials of the ILD layer 182 may also be close to 3.8. In some embodiments, the k values of the low-k dielectric materials are lower than about 3.0, and may be lower than about 2.5. The first ILD layer 182 may be formed using CVD, PVD, ALD, spinning coating, or other suitable deposition methods. The formation of the first-type conductive vias may include a plasma-enhanced operation, whereby more charges C1 accumulate in the DNW region 110.

Referring to FIG. 15, the first ILD layer 182 is patterned to form trenches O12, O14 and O16. The trenches O12, O14 and O16 may be formed using an etching operation, such as a dry etching or an RIE, to remove portions of the first ILD layer 182. The etching operation may be enhanced via introduction of plasma, which may lead to additional accumulation of charges C1. In some embodiments, the trenches O12, O14 and O16 respectively exposes the underlying doped regions 132 and 134 and the underlying gate electrodes 14 and 24.

Referring to FIG. 16, conductive vias 152 and 154 are formed in the first ILD layer 182. The conductive vias 152 and 154 may be formed by depositing a conductive material such as aluminum, gold, silver, copper, cobalt, tungsten, titanium, titanium nitride, tantalum, tantalum nitride, or other suitable materials into the trenches O12 and O14. The deposition may include CVD, PVD, ALD, or the like, and may be enhanced by introduction of plasma. Subsequently, a CMP operation may be performed to level the surface of the first ILD layer 182 to remove an excess conductive material. In some embodiments, the first ILD layer 182 and the conductive vias 152 and 154 are at the same level of the first transistor T10 and the second transistor T20 over the substrate 100. In some embodiments, the conductive vias 152 and 154 are electrically coupled to the doped regions 132 and 134, respectively.

Conductive vias (gate vias) 15 and 25 are respectively formed in the first MD layer 182. The conductive vias 15 and 25 may be formed by respectively depositing a conductive material into the trenches O16. The conductive material used to form the conductive vias 15 and 25 may be the same conductive material used to form the conductive vias 152 and 154. An etch-back operation may be performed to remove portions of the conductive material in the trenches O16 such that top surfaces of the conductive material are substantially level with a top surface of the conductive via 154 or the conductive via 152. As such, the conductive vias 15 and 25 are formed. The formation of the conductive vias 15 and 25 may include a plasma-enhanced operation, whereby more charges C1 accumulate in the DNW region 110.

Figure 17:
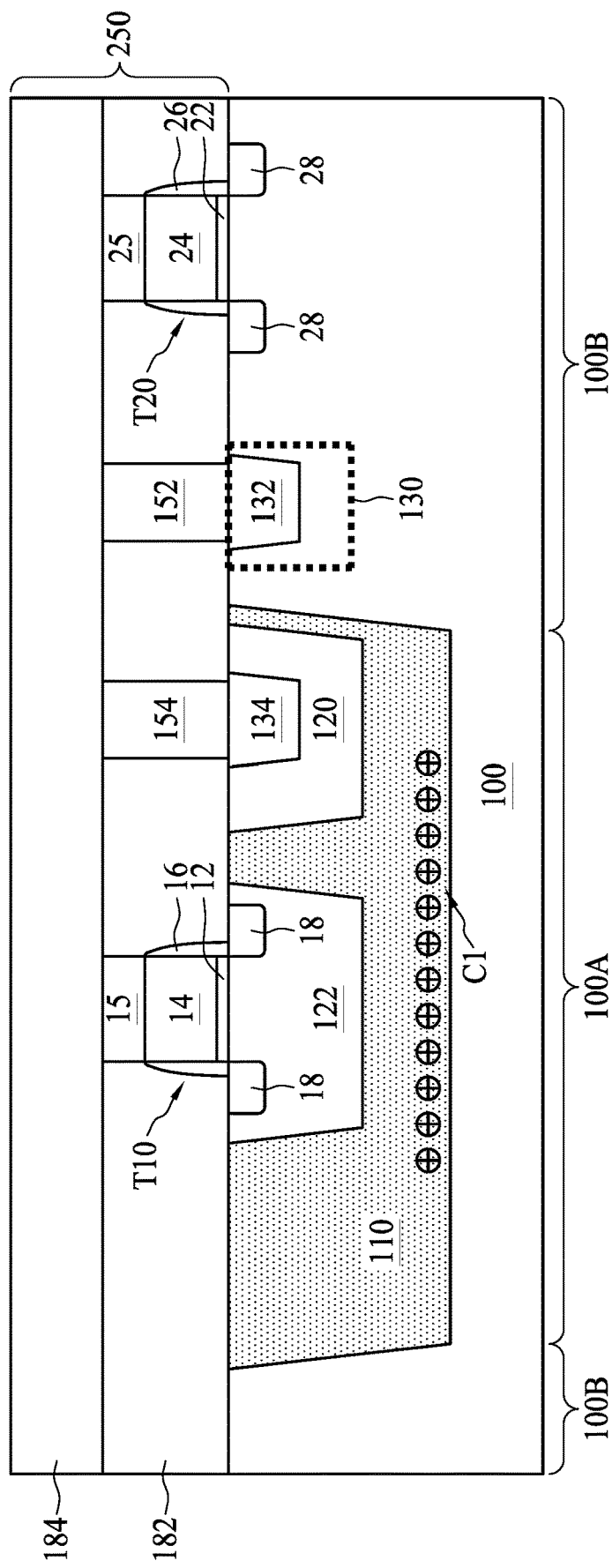
Figure 18:
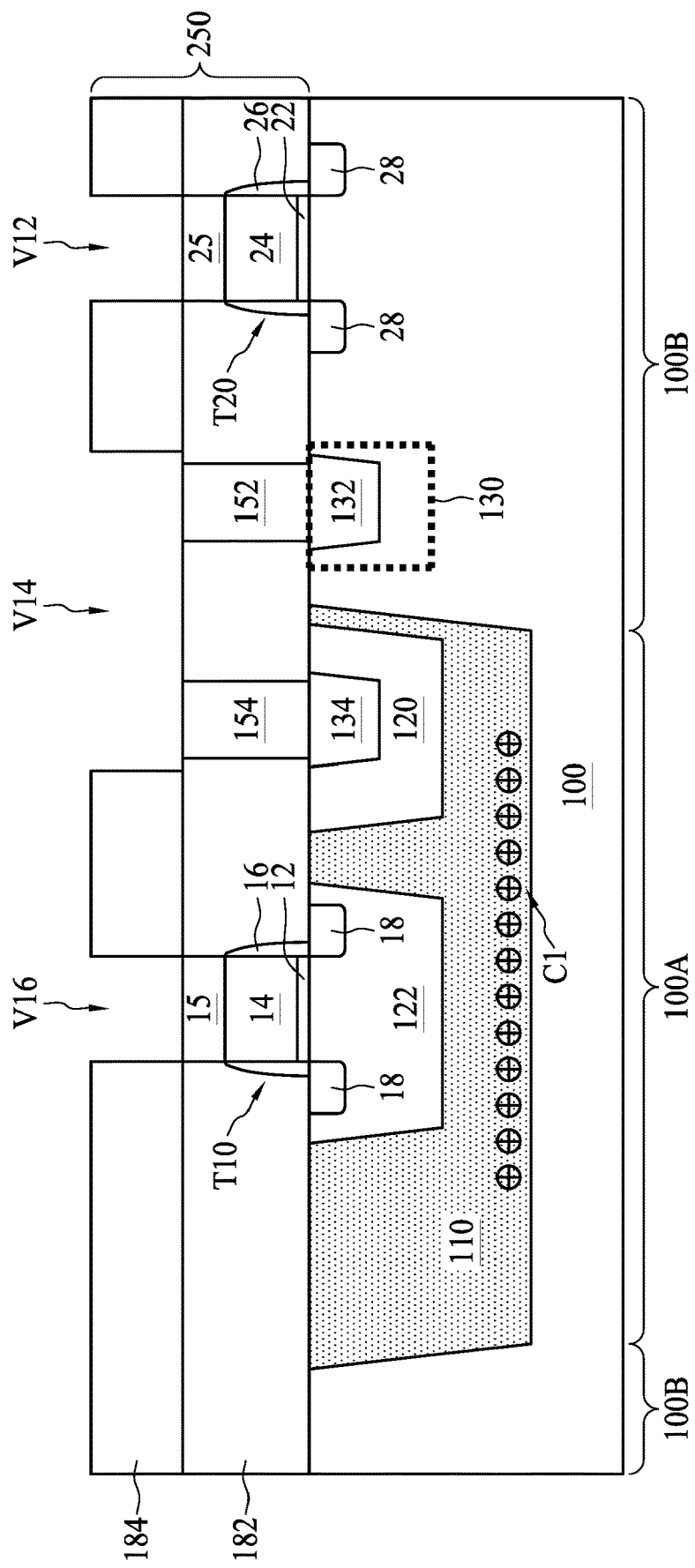
Figure 19:
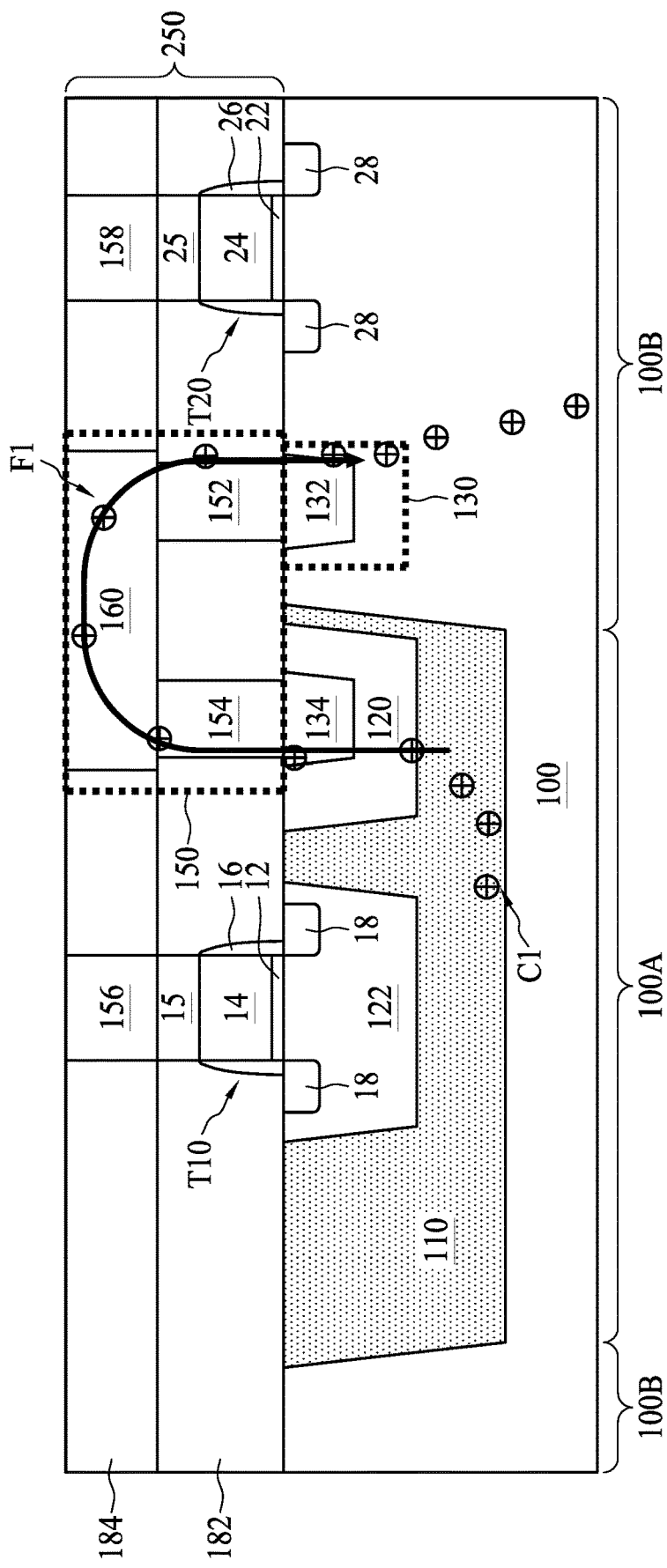

Referring to operation 215 of FIG. 3, a plurality of second-type conductive vias are formed over the substrate 100, as shown in FIGS. 17 to 19. Referring to FIG. 17, a second ILD layer 184 is formed over the first ILD layer 182. The second ILD layer 184 may be formed of the same material as the first ILD layer 182 or formed using the same deposition method as the first ILD layer 182. In some embodiments, an interface between the first ILD layer 182 and the second ILD layer 184 is found since the first ILD layer 182 undergoes a CMP operation prior to the formation of the second ILD layer 184. The formation of the second-type conductive vias may include a plasma-enhanced operation, whereby more charges C1 accumulate in the DNW region 110.

Referring to FIG. 18, the second ILD layer 184 is patterned to form trenches V12, V14 and V16. The trenches V12, V14 and V16 may be formed using an etching operation to remove portions of the second ILD layer 184. In some embodiments, the trench V12 exposes the underlying conductive via 25. In some embodiments, the trench V14 exposes the underlying conductive vias 152 and 154. In some embodiments, the trench V16 exposes the underlying conductive via 15. The etching operation may be performed by a plasma-enhanced operation, thereby causing more charges C1 to accumulate in the DNW region 110.

Referring to FIG. 19, conductive vias 156, 158 and 160 are formed in the second ILD layer 184. The conductive vias 156, 158 and 160 may be formed by respectively depositing a conductive material into the trenches V12, V14 and V16. The conductive material used to form the conductive vias 156, 158 and 160 may be the same conductive material used to form the conductive vias 152 and 154. Subsequently, a CMP operation may be performed to level the surface of the second ILD layer 184 to remove an excess conductive material. In some embodiments, the second ILD layer 184 are substantially at the same level as the conductive vias 156, 158 and 160. In some embodiments, the conductive vias 156 and 158 are respectively formed over the conductive vias 15 and 25. The conductive via 156 formed over the first transistor T10 may be electrically coupled to the gate electrode 14 through the conductive via 15. The conductive via 158 formed over the second transistor T20 may be electrically coupled to the gate electrode 24 through the conductive via 25. In some embodiments, the conductive via 160 is formed over the conductive vias 152 and 154. In such embodiments, the conductive via 160 electrically couples the conductive via 152 to the conductive via 154. The formation of the conductive vias 156, 158 and 160 may include a plasma-enhanced operation, whereby more charges C1 accumulate in the DNW region 110.

Still referring to FIG. 19, in some embodiments, the conductive via 152, the conductive via 160 and the conductive via 154 form a first discharge structure 150 over the substrate 100. The first discharge structure 150 may have a U-shaped profile from a cross-sectional perspective. The first discharge structure 150 may extend across a boundary between the first circuit region 100A and the second circuit region 100B from a top-view perspective. In some embodiments, the conductive via 160 of the first discharge structure 150 has a top surface substantially level with a top surface of the conductive via 158 or the conductive via 156. In some embodiments, the first discharge structure 150 electrically couples the doped region 134 to the doped region 132 and forms a discharge path F1 between the doped region 134 and the doped region 132. In such embodiments, the doped region 134 is electrically coupled to the diode 130 through the discharge path F1 of the first discharge structure 150. Further, the DNW region 110 in the first circuit region 100A may be electrically coupled to the substrate 100 in the second circuit region 100B through the discharge path F1. In some embodiments, the accumulating charges C1 can be drained from the DNW region 110 to the substrate 100 through the doped region 134 and the first discharge structure 150. That is, the charges C1 accumulating in the DNW region 110 can be drained from the first circuit region 100A to the second circuit region 100B through the first discharge structure 150. As a result, in an early stage of the formation of the interconnect layer 250, the accumulating charges C1 are directed toward the diode 130 instead of flowing through the gate dielectrics 12, 22, the dielectric materials of the first ILD layer 182 or the dielectric materials of the second ILD layer 184. The gate dielectrics 12, 22, the dielectric materials of the first ILD layer 182 or the dielectric materials of the second ILD layer 184 can be protected from damage of plasma induced charges.

Figure 20:
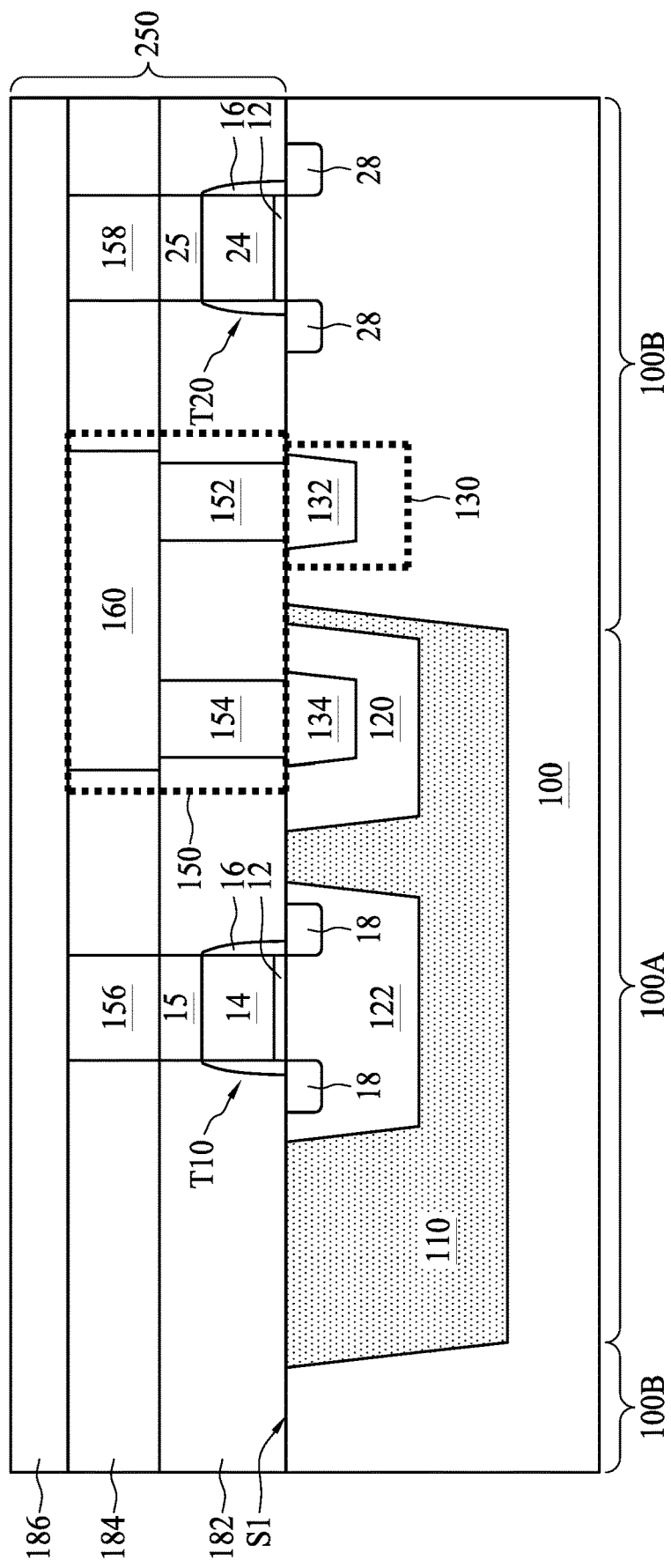
Figure 21:
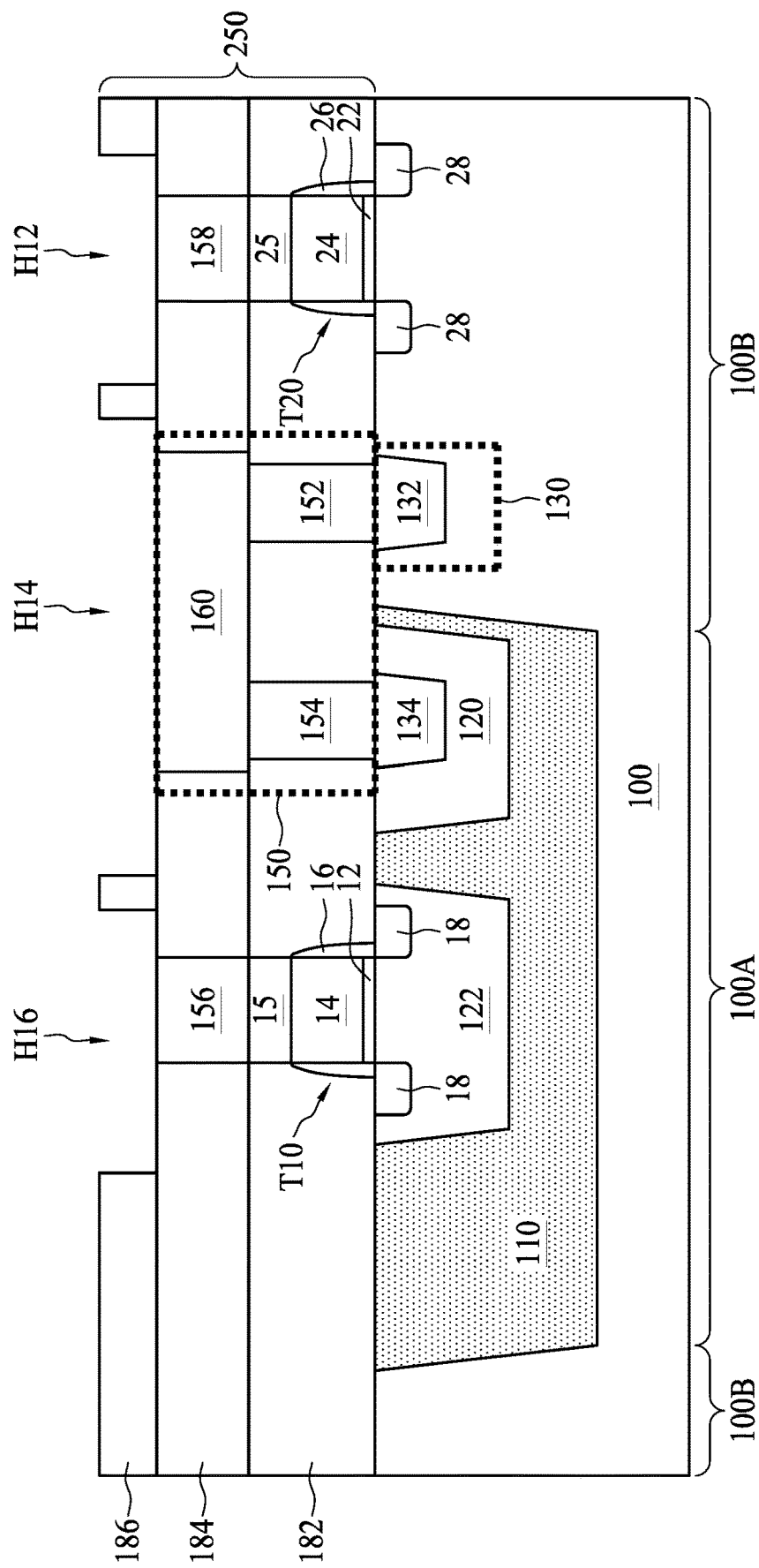
Figure 22:
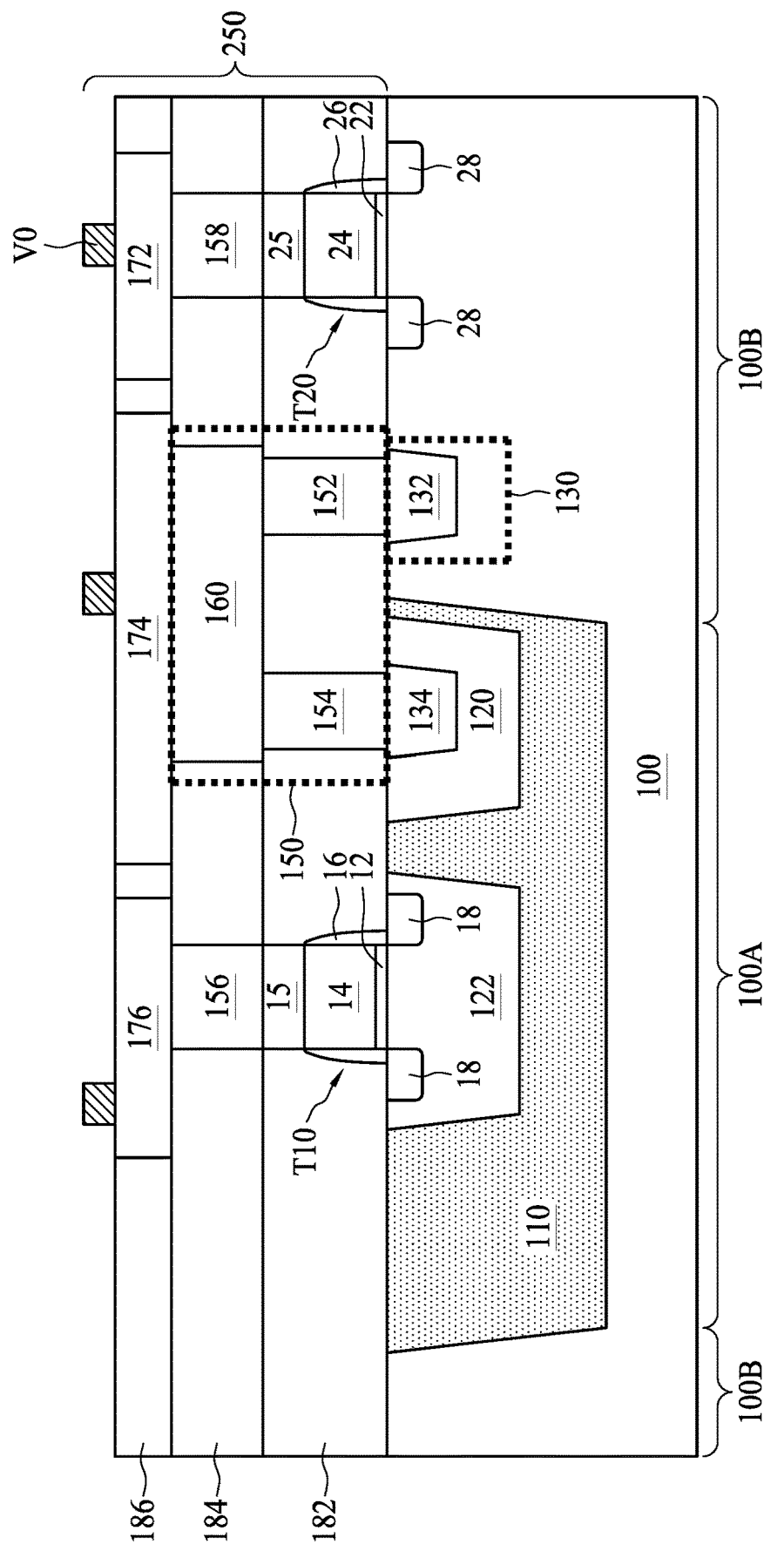
Figure 23:
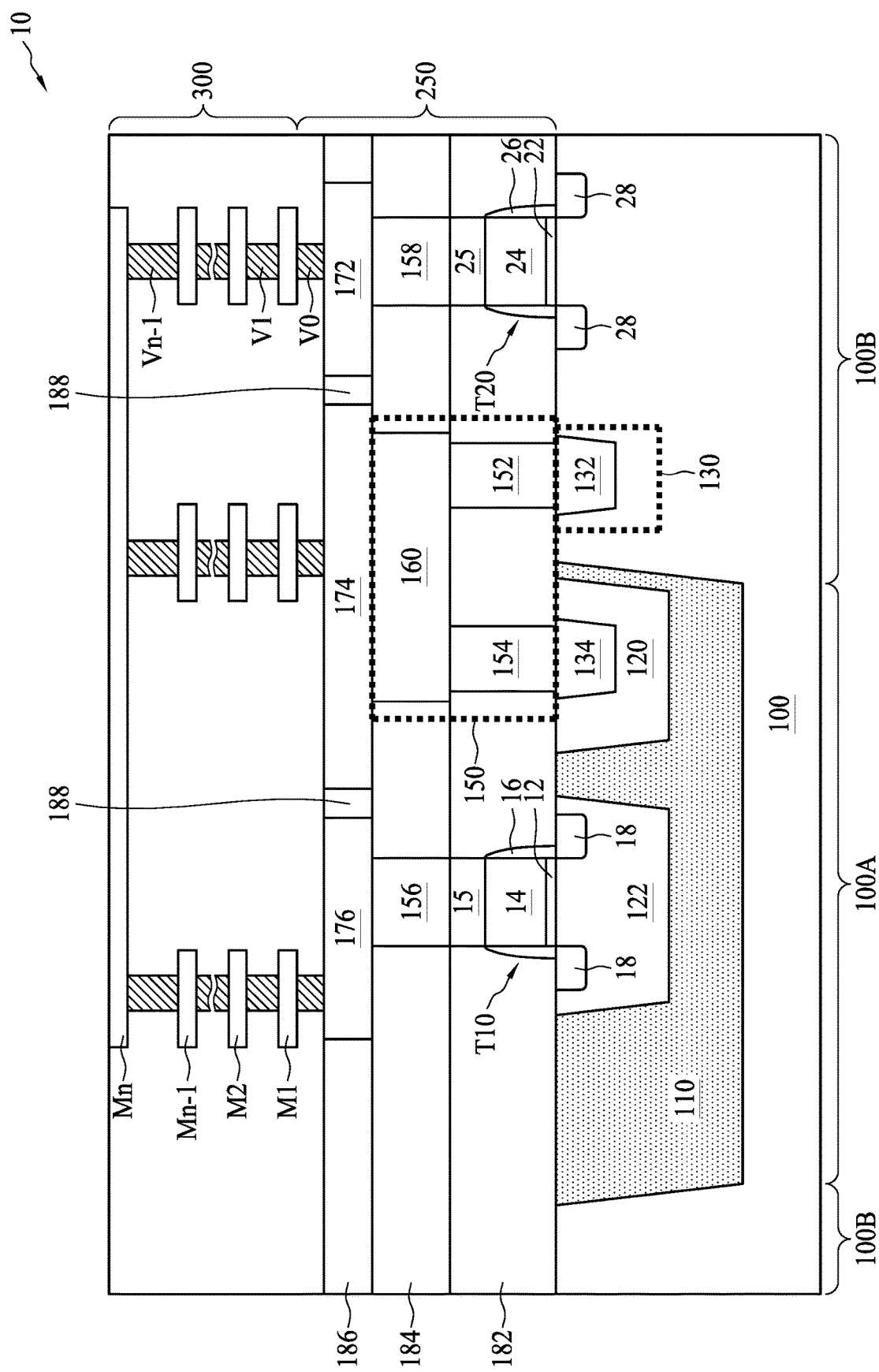

Referring to operation 217 of FIG. 3, a plurality of metal line layers and metal via layers are formed over the substrate 100, as shown in FIGS. 20 to 22. The metal line layers and metal via layers may be a stacked routing structure formed in the MEOL stage. The metal line layers may refer to horizontally-extending metallic lines and the via layers may refer to vertically-extending metallic lines. In some embodiments, some lower layers of the stacked routing structure, e.g., the metal line layer Mo and the metal via layer $V_0$ show in FIG. 22, are regarded as portions of the interconnect layer 250, and some higher layers of the stacked routing structure, e.g., the metal line layer $M_1$ and the metal via layer $V_1$ show in FIG. 23, are regarded as portions of the metallization layer 300 over the interconnect layer 250.

In some embodiments, the metal line layers and metal via layers included in the interconnect layer 250 are configured to electrically route each of the underlying transistors, e.g., the first transistor T10 and the second transistor T20 rather than electrically coupling the transistors across different circuit regions (e.g., coupling the first transistor T10 to the second transistor T20). In some embodiments, the metal line layers and metal via layers included in the metallization layer 300 is configured to electrically couple transistors, in the first circuit region 100A e.g., the first transistor T10, to those in the second circuit region 100B e.g., the second transistor T20.

Referring to FIG. 20, a third ILD layer 186 is formed on the second. ILD layer 184. The third ILD layer 186 may be formed of the same material using the same deposition method as the first ILD layer 182 or the second ILD layer 184. In some embodiments, an interface exists between the second ILD layer 184 and the third ILD layer 186 since the second ILD layer 184 undergoes a CMP operation to level its top surface.

Referring to FIG. 21, the third ILD layer 186 is patterned to form openings H12, H14 and H16. The openings H12, H14 and H16 may be formed using an etching operation to remove portions of the third ILD layer 186. In some embodiments, the openings H12, H14 and H16 respectively expose the underlying conductive vias 158, 160 and 156.

Referring to FIG. 22, metal lines 172, 174 and 176 are formed in the respective openings H12, H14 and H16. The metal lines 172, 174 and 176 may be formed by respectively depositing a conductive material into the openings H12, H14 and H16. The conductive material used to form the metal lines 172, 174 and 176 may be the same conductive material used to form the conductive vias 156, 158 and 160 or the conductive vias 152 and 154. Subsequently, a CMP operation may be performed to level the surface of the third ILD layer 186 to remove the excess conductive materials. In some embodiments, the metal line 176 is formed over the first transistor T10 and electrically coupled to the gate electrode 14 through the conductive via 156 and the conductive via 15. In some embodiments, the metal line 172 is formed over the second transistor T20 and electrically coupled to the gate electrode 24 through the conductive via 158 and the conductive via 25. In some embodiments, the metal line 174 is formed over the first discharge structure 150 and electrically coupled to the conductive via 160. In some embodiments, the discharge structure 150 is interposed between the metal line 174 and the substrate 100. In some embodiments, the metal line 174 is included in the discharge structure 150. After the metal lines 172, 174 and 176 are formed, a plurality of via layers Va may be respectively formed on and electrically coupled to the metal lines 172, 174 and 176. As such, the interconnect layer 250 including the metal lines 172, 174 and 176 and the via layers Va is completed.

In operation 219, the metallization layer 300 is formed over the substrate 100, as shown in FIG. 23. In some embodiments, the metallization layer 300 is formed over the interconnect layer 250. The metallization layer 300 may refer to a stacked routing structure formed in the BEOL stage. The metallization layer 300 may include multiple metallization layers $M_n$, in which n is an integer greater than or equal to 1, and multiple via layers $V_{n-1}$, in which n is an interger greater than 1, alternatively stacked with each other. The number of n may be configured according to the design requirements of the metallization layer 300. The metallization layers $M_n$ and the via layers $V_{n-1}$ may be formed using series of lithographic operations, etching operations, deposition operations and planarization operations. As such, the first semiconductor structure 10 is formed.

In some embodiments, the metallization layer 300 couples the first transistor T10 in the first circuit region 100A to the second transistor T20 in the second circuit region 100B. In such embodiments, the coupling of the first transistor T10 and the second transistor T20 is achieved through the metallization layer 300 subsequently to the formation of the diode 130 and the discharge structure 150. In some embodiments, the interconnect layer 250 only couples the first transistor T10 to the metallization layer 300 or couples the second transistor T20 to the metallization layer 300.

FIGS. 4 to 17 and FIGS. 24 to 29 are schematic cross-sectional views illustrating sequential operations of the method 200 of forming a second semiconductor structure 20, in accordance with some embodiments of the present disclosure. Some operations used to form the second semiconductor structure 20 are similar to those used to form the first semiconductor structure 10 and descriptions of these operations are omitted for brevity.

Figure 24:
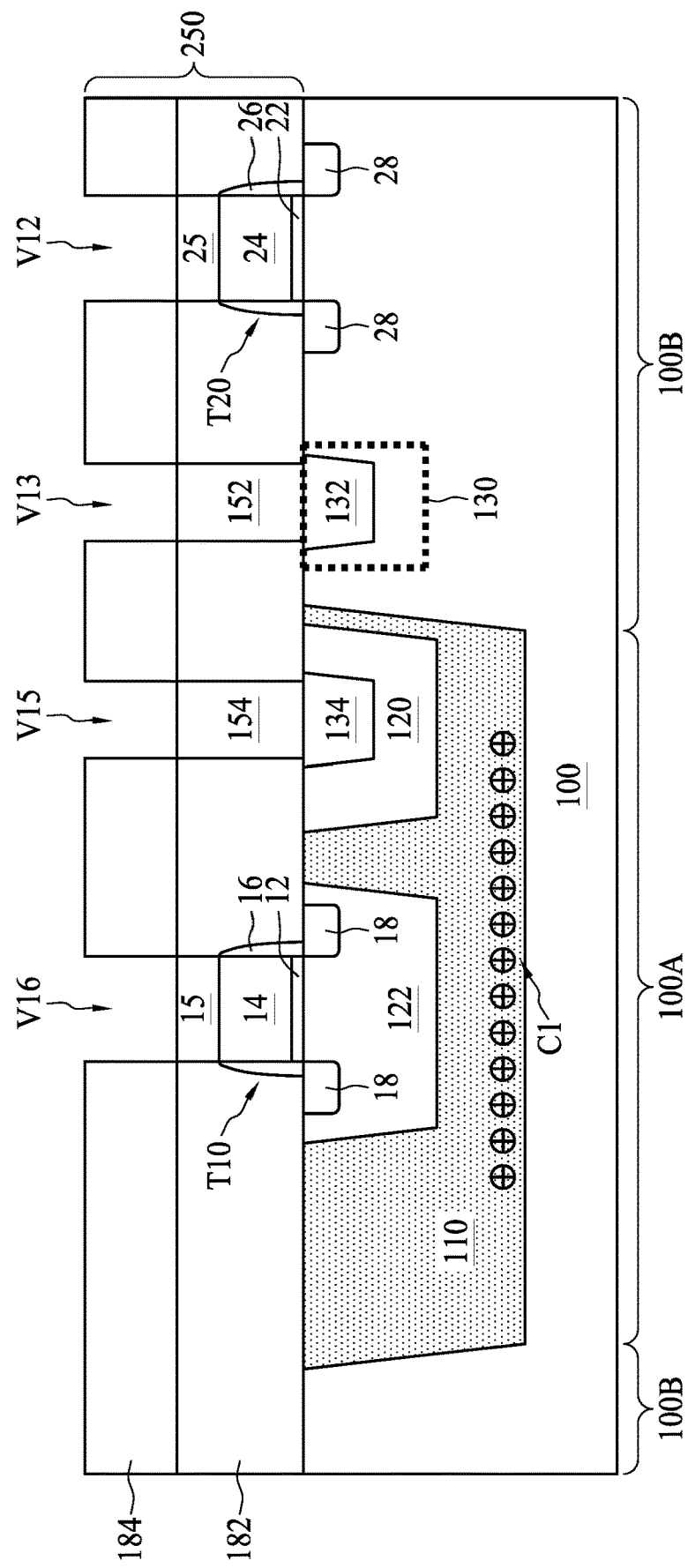

Continued from FIG. 17 and referring to FIG. 24, the second ILD layer 184 is patterned to form trenches V12, V13, V15 and V16. The trenches V12, V13, V15 and V16 may be formed using an etching operation to remove portions of the second ILD layer 184. In some embodiments, the trenches V16 and V12 respectively expose the underlying conductive vias 15 and 25. In some embodiments, the trenches V13 and V15 respectively expose the underlying conductive vias 152 and 154. The etching operation may be performed by a plasma-enhanced operation, whereby more charges C1 accumulate in the DNW region 110.

Figure 25:
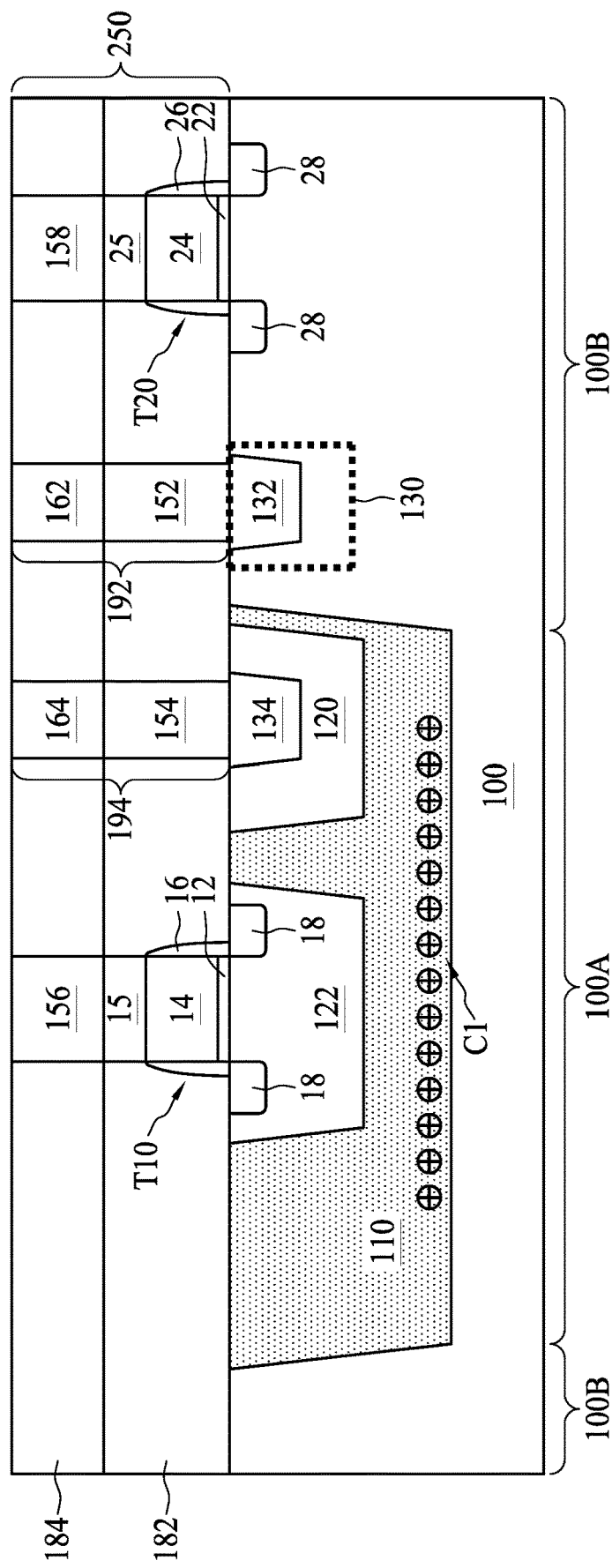
Figure 26:
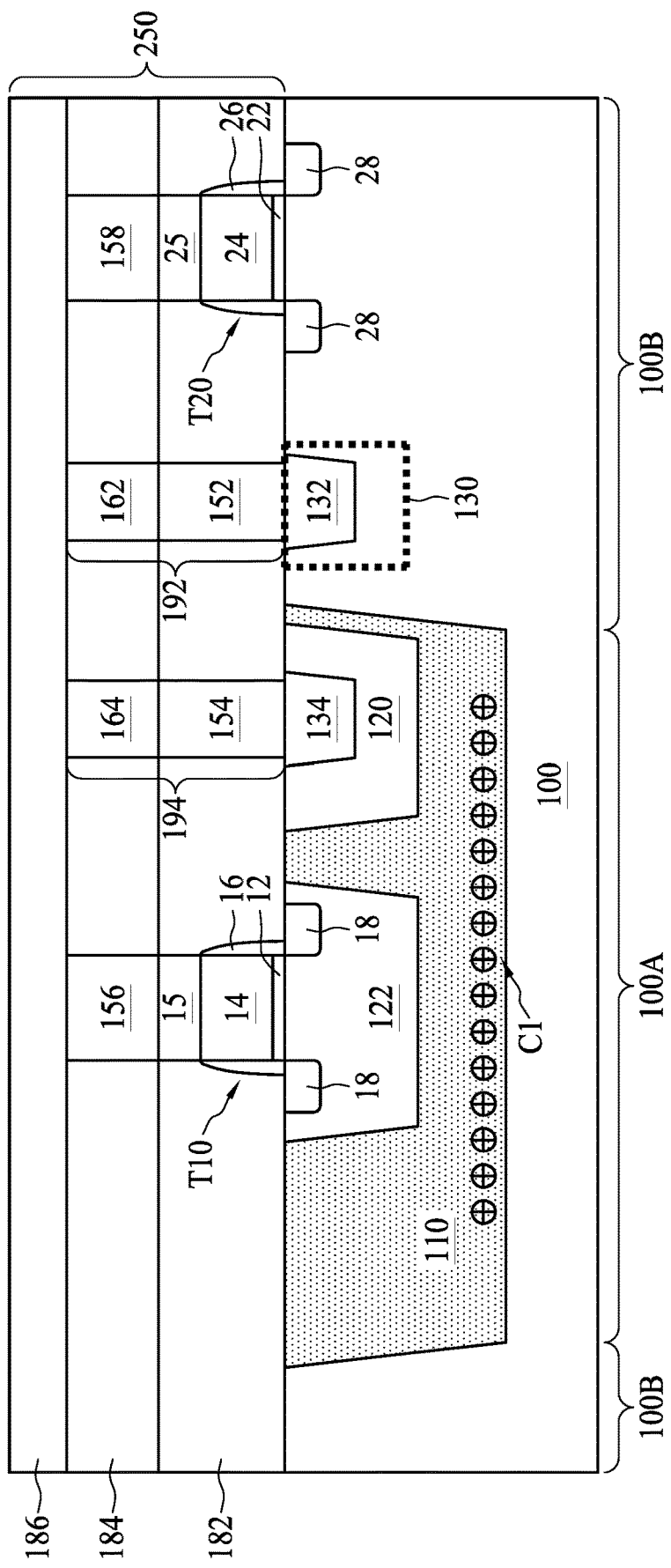

Referring to FIG. 25, conductive vias 156, 158, 162 and 164 are formed in the second ILD layer 184. The conductive vias 156, 158, 162 and 164 may be formed by respectively depositing a conductive material into each of the trenches V16, V12, V13 and V15. The conductive material used to form the conductive vias 156, 158, 162 and 164 may be the same conductive material used to form the conductive vias 152 and 154. Subsequently, a CMP operation may be performed to level the surface of the second ILD layer 184 to remove an excess conductive material, In some embodiments, the second ILD layer 184 are substantially at the same level as the conductive vias 156, 158, 162 and 164. In some embodiments, the conductive vias 156 and 158 are respectively formed on the conductive vias 15 and 25. In some embodiments, the conductive vias 162 and 164 are respectively formed on the conductive vias 152 and 154. In such embodiments, the conductive vias 162 and 164 are respectively electrically coupled to the conductive vias 152 and 154. The conductive via 162 and the conductive via 152 may form a conductive member 192. The conductive via 164 and the conductive via 154 may form a conductive member 194.

Figure 28:
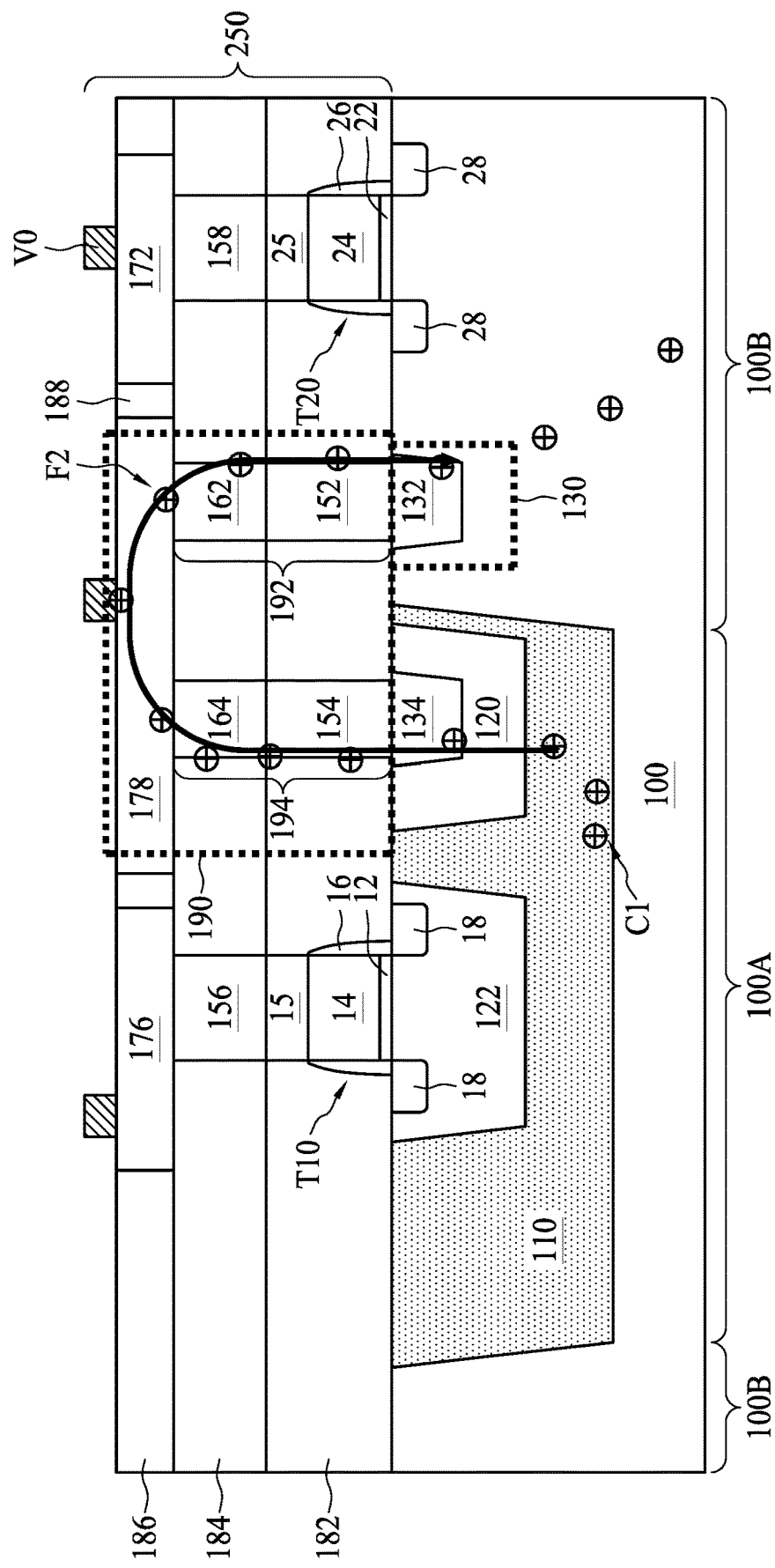

Referring to FIG. 28, a third ILD layer 186 is formed on the second ILD layer 184.

Figure 27:
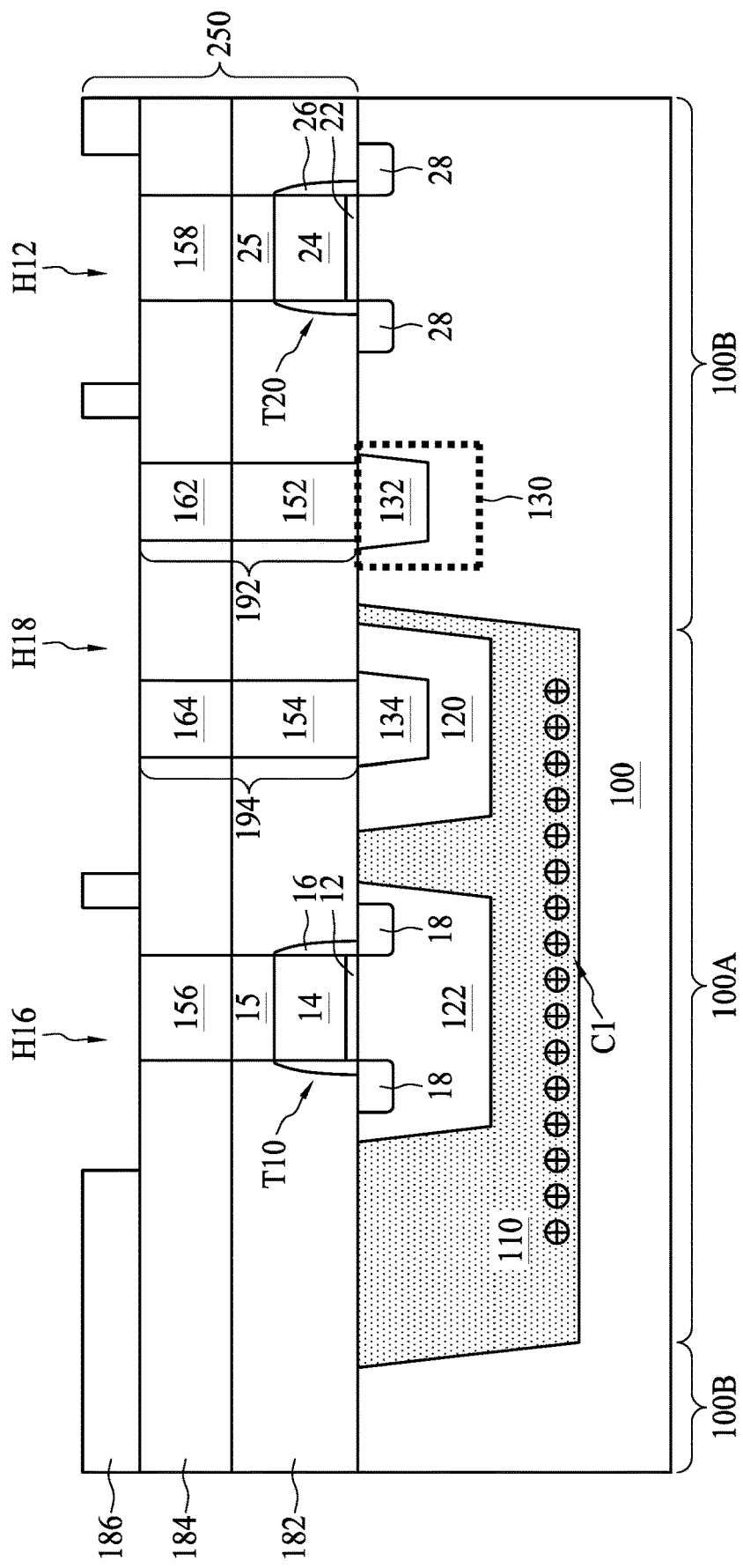

Referring to FIG. 27, trenches H12, H16 and 1118 are formed in the third ILD layer 186. The trenches H12, H16 and H18 may be formed using an etching operation to remove portions of the third ILD layer 186. In some embodiments, the trenches H12 and H16 respectively expose the underlying conductive vias 158 and 156. In some embodiments, the trench H18 exposes the underlying conductive vias 162 and 164. The etching operation may be performed by a plasma-enhanced operation, whereby more charges C1 accumulate in the DNW region 110.

Referring to FIG. 28, metal lines 172, 176 and 178 are formed in the third ILD layer 186. The metal lines 172, 176 and 178 may be formed by respectively depositing a conductive material into the trenches H12, H16 and H18. The conductive material used to form the metal lines 172, 176 and 178 may be the same conductive material used to form the conductive vias 156, 158, 162 and 164 or the conductive vias 152 and 154. Subsequently, a CMP operation may be performed to level the surface of the third layer 186 to remove an excess conductive material. In some embodiments, the third ILD layer 186 are substantially at the same level as the metal lines 172, 176 and 178. In some embodiments, the metal line 176 is formed over the first transistor T10 and electrically coupled to the gate electrode 14 through the conductive via 156 and the conductive via 15. In some embodiments, the metal line 172 is formed over the second transistor T20 and electrically coupled to the gate electrode 24 through the conductive via 158 and the gate via 25. In some embodiments, the metal line 178 is formed on the conductive vias 162 and 164. In such embodiments, the metal line 178 electrically couples the conductive via 162 to the conductive via 164.

Still referring to FIG. 28, in some embodiments, the conductive member 192, the metal line 178 and the conductive member 194 form a second discharge structure 190 over the substrate 100. The second discharge structure 190 may have a U-shaped profile from a cross-sectional perspective. The second discharge structure 190 may extend across a boundary between the first circuit region 100A and the second circuit region 100B from a top-view perspective. In some embodiments, the metal line 178 of the second discharge structure 190 has a bottom surface substantially level with a top surface of the conductive via 158 or the conductive via 156. In some embodiments, the second discharge structure 190 electrically couples the doped region 134 to the doped region 132 and forms a discharge path F2 between the doped region 134 and the doped region 132. In such embodiments, the doped region 134 is electrically coupled to the diode 130 through the discharge path F2 of the second discharge structure 190. Further, the first circuit region 100A may be electrically coupled to the second circuit region 100B through the discharge path F2. In some embodiments, the charges C1 can be drained from the DNW region 110 to the substrate 100 through the doped region 134 and the second discharge structure 190. That is, the charges C1 accumulating in the DNW region 110 can be drained from the first circuit region 100A to the second circuit region 100B through the second discharge structure 190. As a result, in an early stage of the formation of the interconnect layer 250, the charges C1 can be directed toward the diode 130 instead of flowing through the gate dielectric 12, the gate dielectric 22. The gate dielectrics 12, 22, the dielectric materials of the first iii) layer 182 or the dielectric materials of the second ILD layer 184 can be protected from damage of plasma induced charges.

After the metal lines 172, 176 and 178 are formed, a metal via layer $V_0$ may be formed over and electrically coupled to the metal lines 172, 176 and 178.

In some embodiments, the discharge structure 150 or 190 is arranged proximal to the boundary between the first circuit region 100A and the second circuit region 100B for achieving desired discharging performance. In some embodiments, the discharge structure 150 or 190 is arranged between any two adjacent transistors, one being in the first circuit region 100A, e.g., the first transistor T10, and the other being in the second circuit region 100B, e.g., the second transistor T20. In some embodiments, the discharge structure 150 or 190 is arranged between any two adjacent conductive vias of the interconnect layer 250, one being in the first circuit region 100A, e.g., the conductive via 156, and the other being in the second circuit region 100B, e.g., the conductive via 158.

Figure 29:
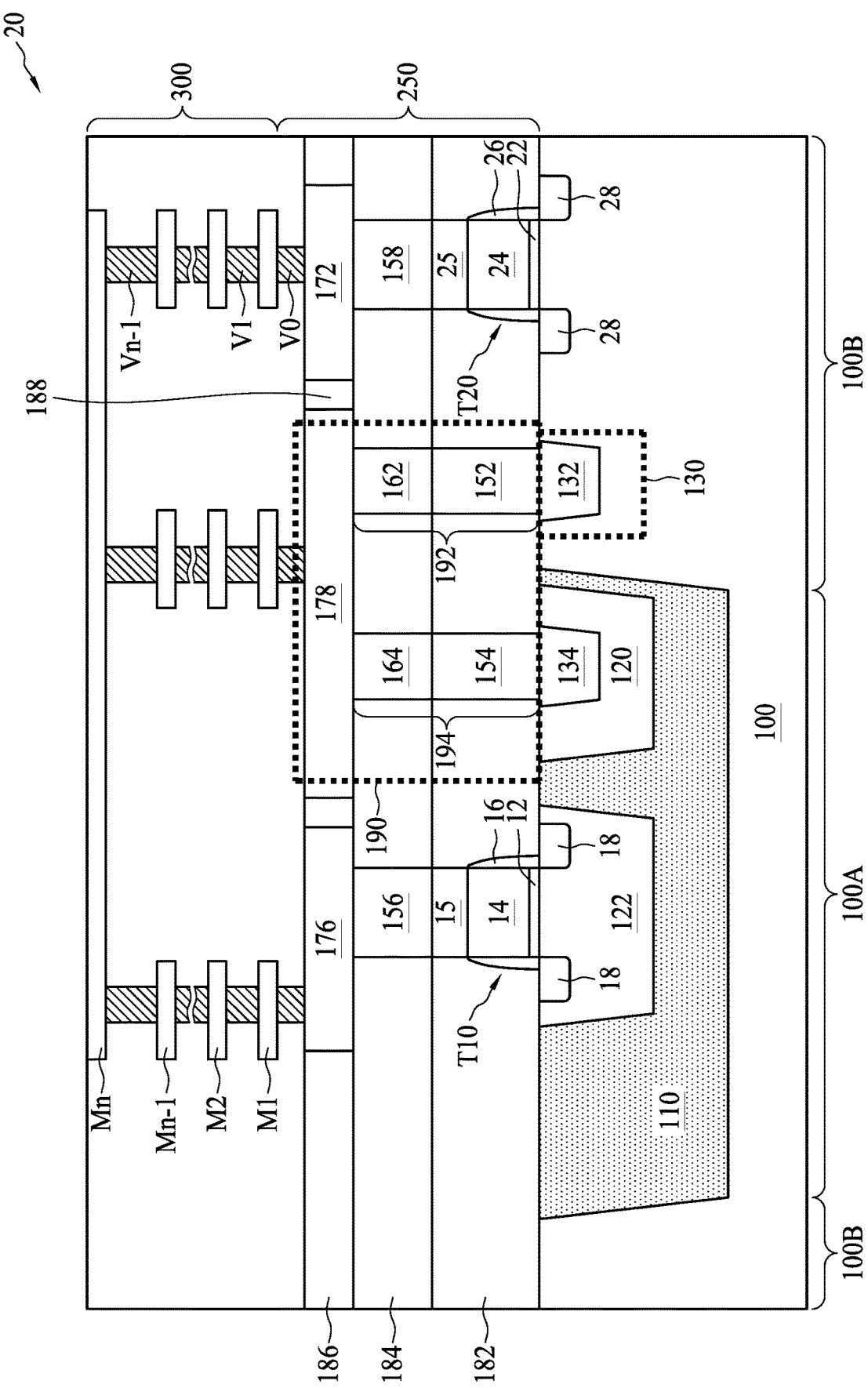

Referring to FIG. 29, the metallization layer 300 is formed over the substrate 100. The descriptions of forming the metallization layer 300 can be referred to those with reference to FIG. 23, and thus are not repeated for brevity. In some embodiments, the metallization layer 300 is formed on the interconnect layer 250. As such, the second semiconductor structure 20 is formed.

FIGS. 30 to 38 are schematic cross-sectional views illustrating sequential operations of the method 200 shown in FIG. 3, in accordance with some other embodiments of the present disclosure. Some operations used to form the third semiconductor structure 30 or the fourth semiconductor structure 40 are similar to those used to form the first semiconductor structure 10 and descriptions of these operations are omitted for brevity.

Figure 30:
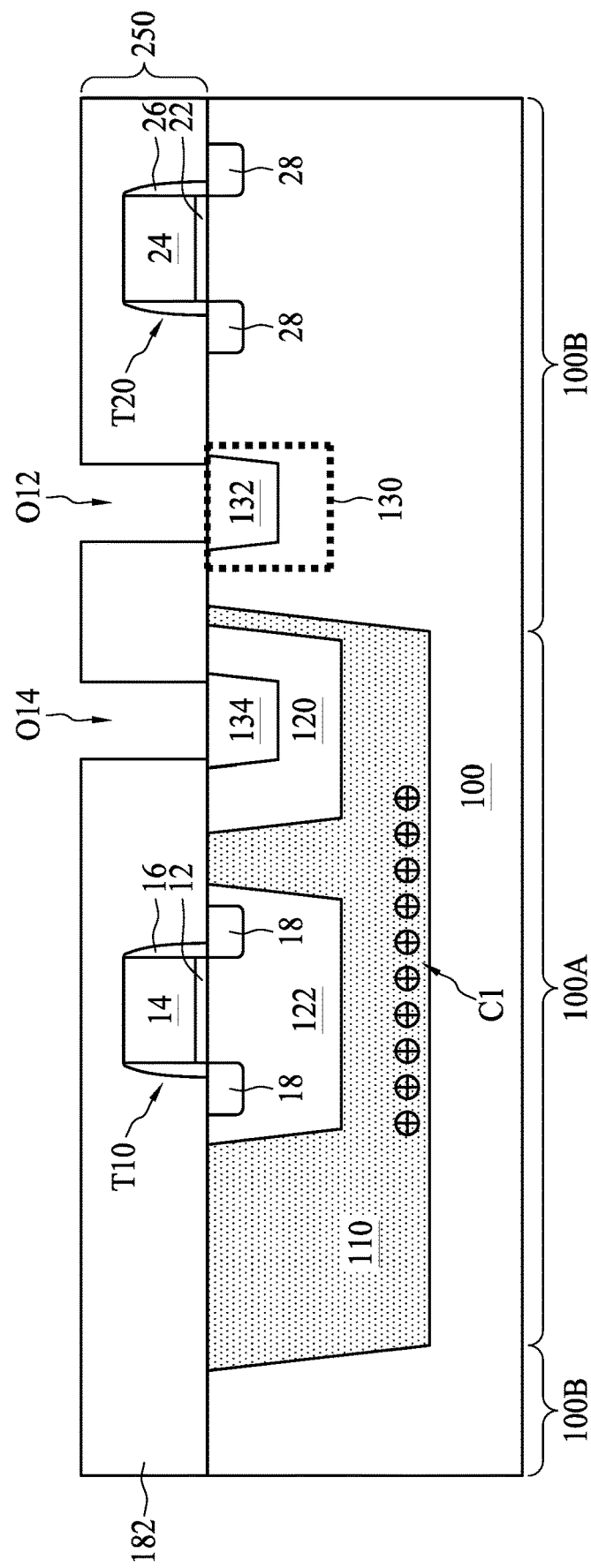
FIGS. 30 to 38 are schematic cross-sectional views illustrating sequential operations of the method shown in FIG. 3, in accordance with some other embodiments of the present disclosure.

Continued from FIG. 14 and referring to FIG. 30, the first ILD layer 182 is patterned to form trenches O12 and O14, which respectively exposes the underlying doped regions 132 and 134.

Figure 31:
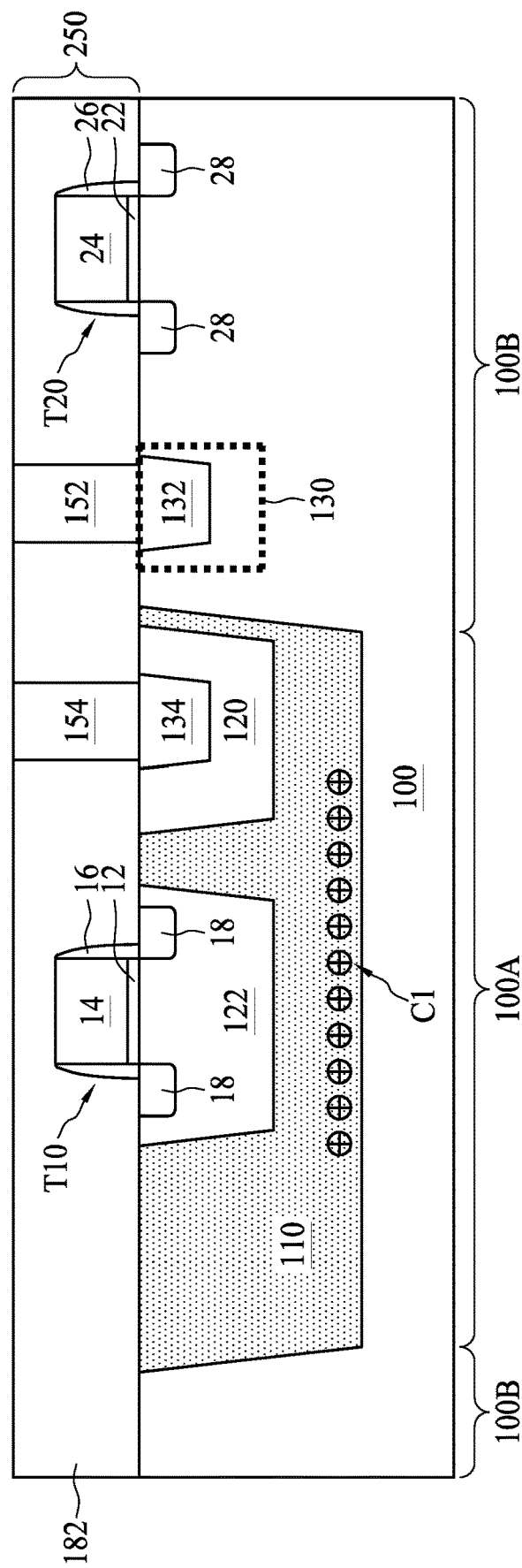

Referring to FIG. 31, conductive vias 152 and 154 are formed in the first ILD layer 182 by depositing a conductive material into the trenches O12 and O14. Subsequently, a CMP operation may be performed to level the surface of the first ILD layer 182 to remove an excess conductive material.

Figure 32:
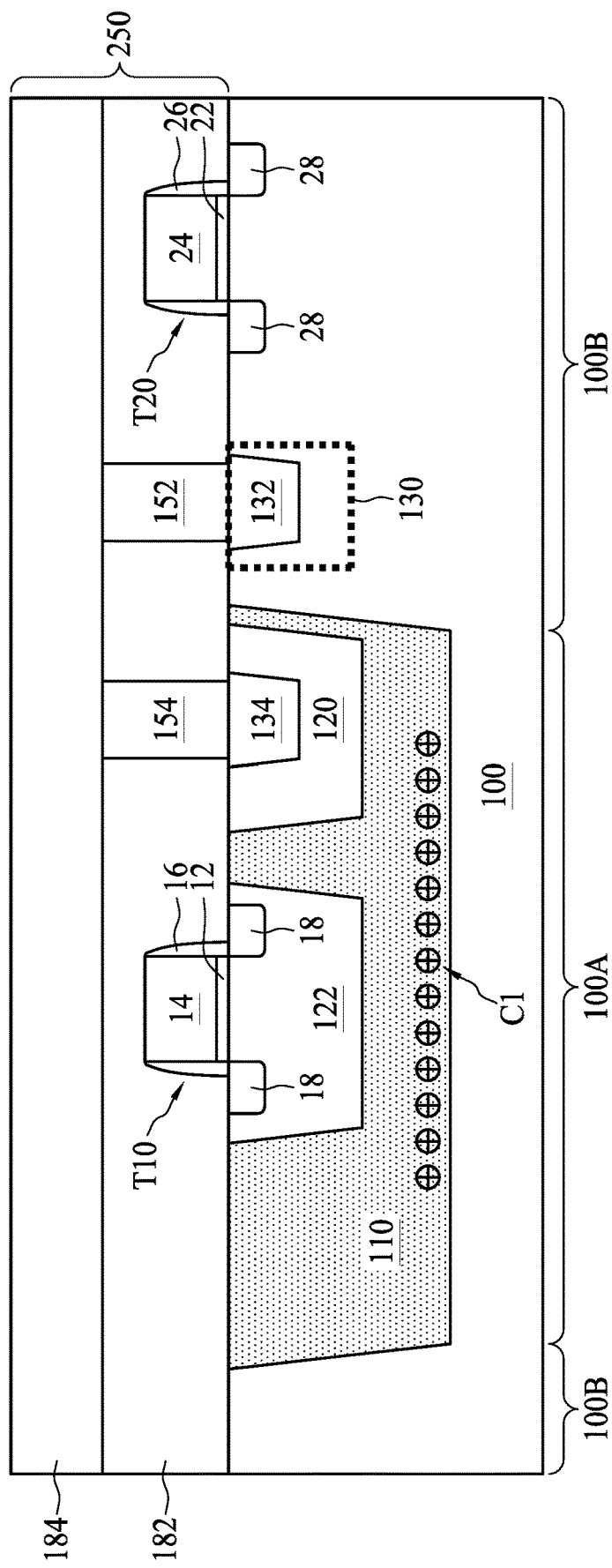

Referring to FIG. 32, a second ILD layer 184 is formed over the first ILD layer 182.

Figure 33:
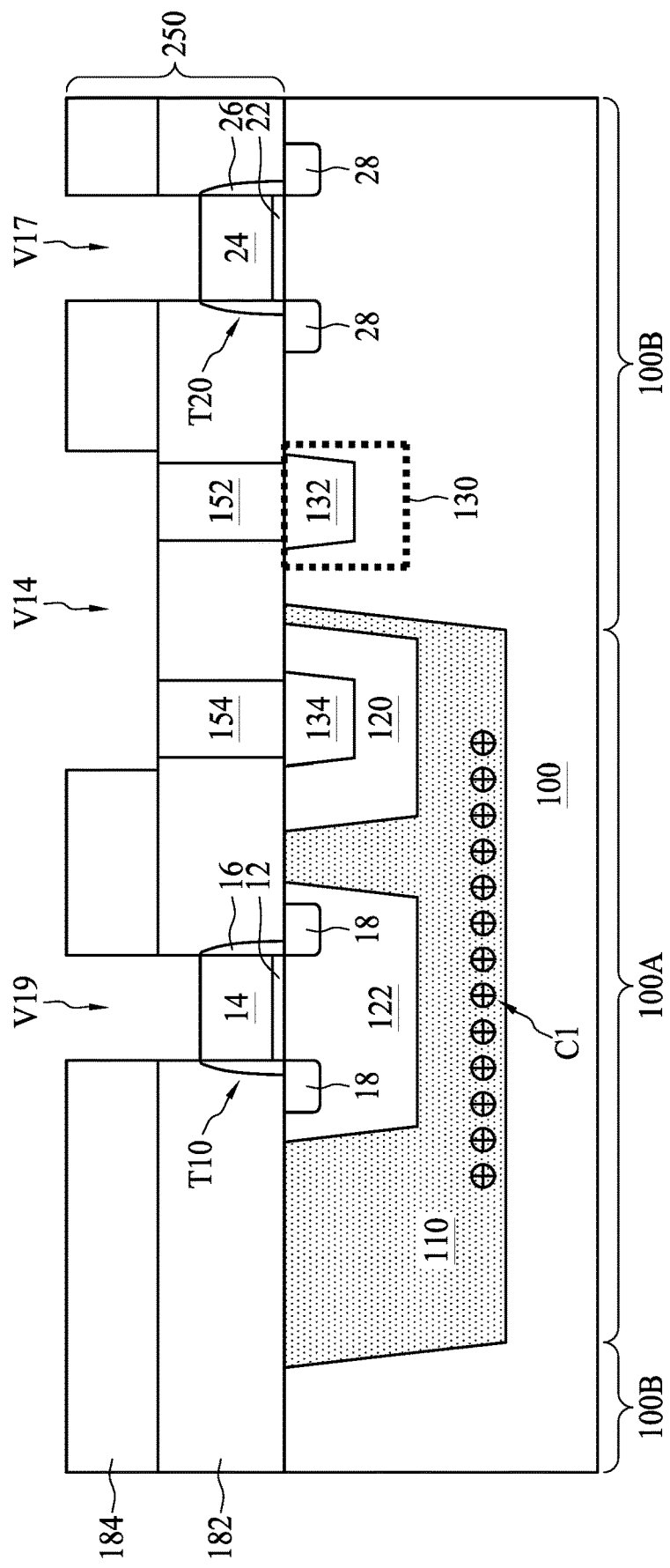

Referring to FIG. 33, the second ILD layer 184 and the first ILD layer 182 are patterned to form trenches V14, V17 and V19. The trenches V14, V17 and V19 may be formed using an etching operation to remove portions of the second ILD layer 184 and portions of the first ILD layer 182. In some embodiments, the trench V17 exposes the underlying gate electrode 24 and the trench V19 exposes the underlying gate electrode 14. In some embodiments, the trench V14 exposes the underlying conductive vias 152 and 154.

Figure 34:
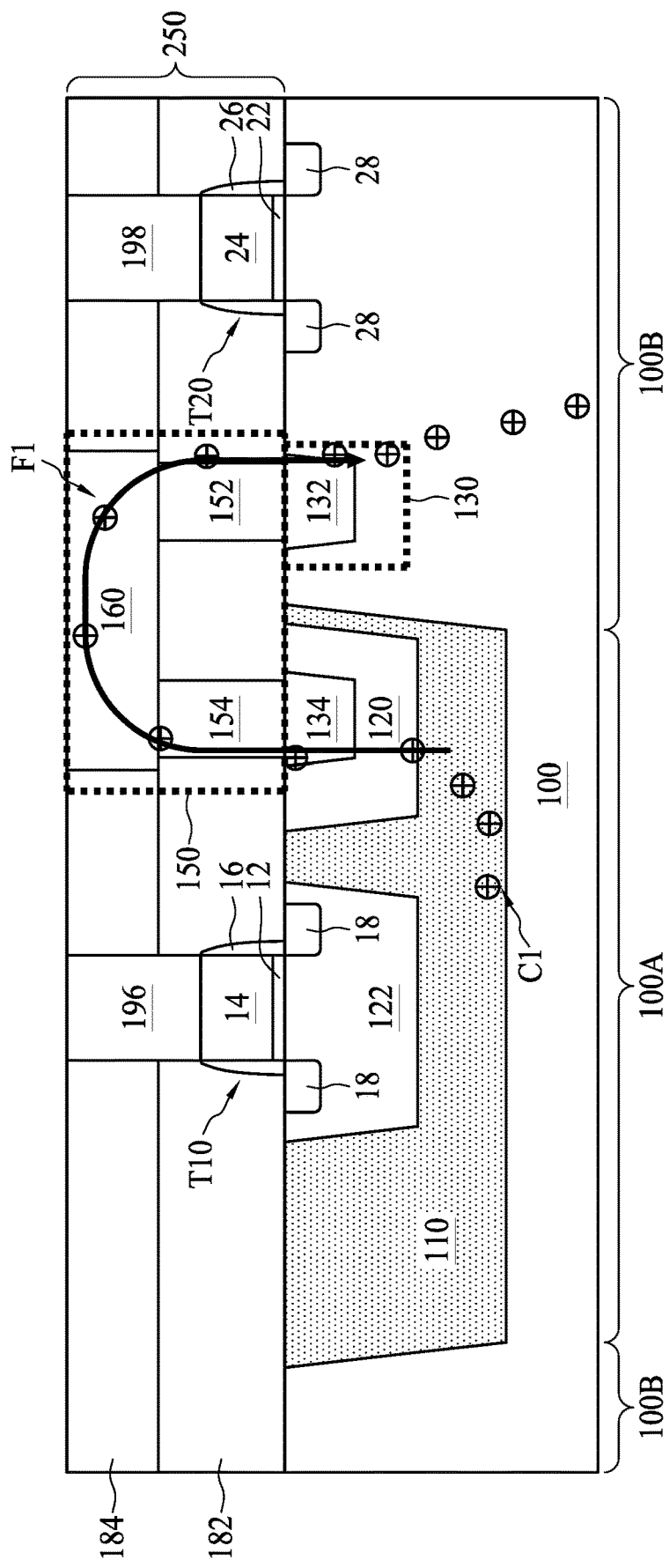

Referring to FIG. 34, conductive vias 160, 196 and 198 are formed in the second ILD layer 184 and the first ILD layer 182 by depositing a conductive material into the trenches V14, V19 and V17. Subsequently, a CMP operation may be performed to level the surface of the second ILD layer 184 to remove an excess conductive material. In some embodiments, the conductive vias 196 and 198 are respectively formed on the gate electrodes 14 and 24. The conductive via 196 formed over the first transistor T10 may be electrically coupled to the gate electrode 14. The conductive via 198 formed over the second transistor T20 may be electrically coupled to the gate electrode 24. In some embodiments, the conductive via 160 is formed over the conductive vias 152 and 154. In such embodiments, the conductive via 160 electrically couples the conductive via 152 to the conductive via 154.

Figure 35:
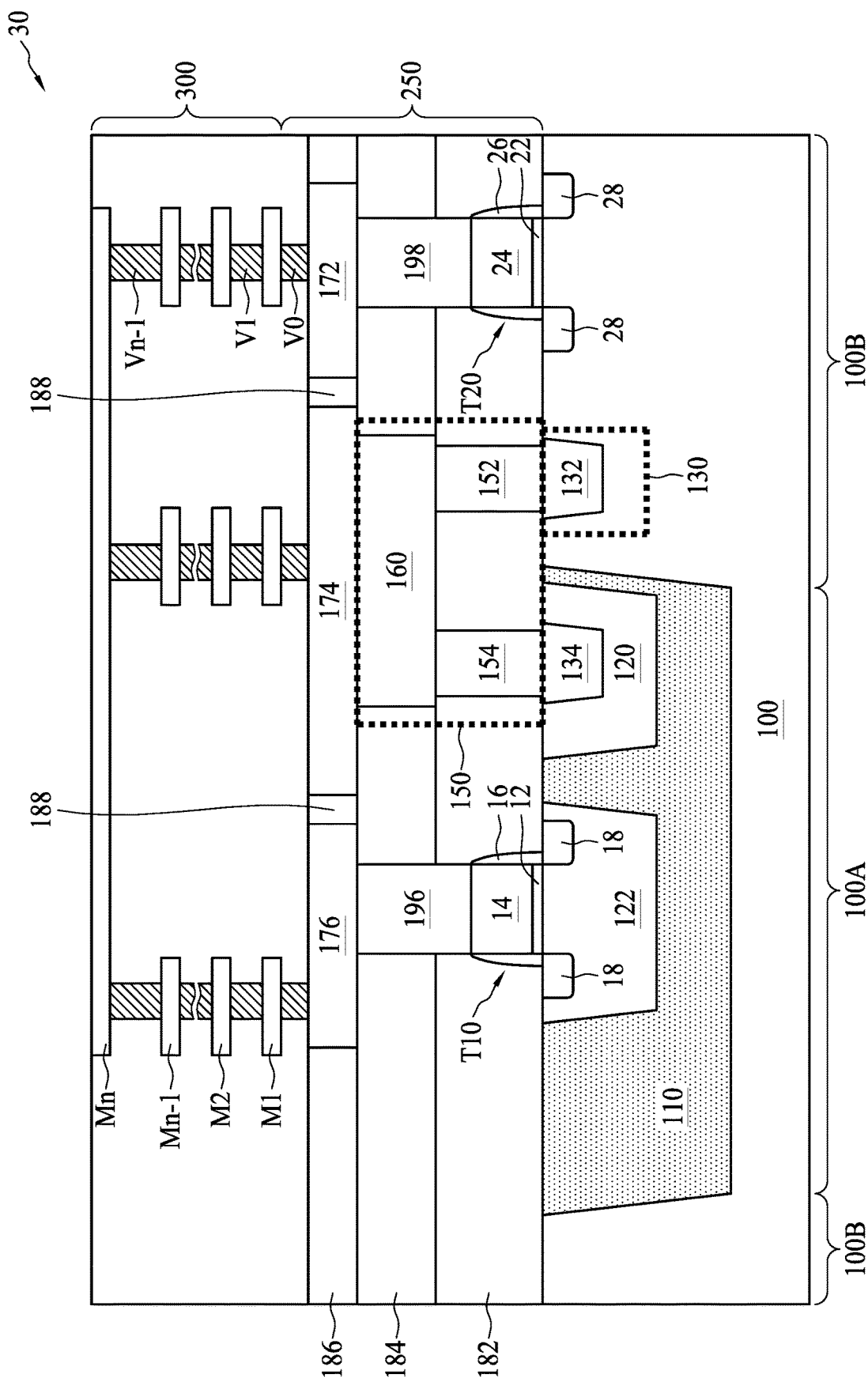

Referring to FIG. 35, a third semiconductor structure 30 may be fabricated by performing operations as shown in FIGS. 20 to 23 after the formation of the conductive vias 160, 196 and 198 shown in FIG. 34. The third semiconductor structure 30 is similar to the first semiconductor structure 10 with differences that the third semiconductor structure 30 includes the conductive via 196 sandwiched between the gate electrode 14 and the metal line 176, and the conductive via 198 sandwiched between the gate electrode 24 and the metal line 172. In some embodiments, the conductive via 196 electrically couples the gate electrode 14 to the metal line 176, and the conductive via 198 electrically couples the gate electrode 24 to the metal line 172.

Figure 36:
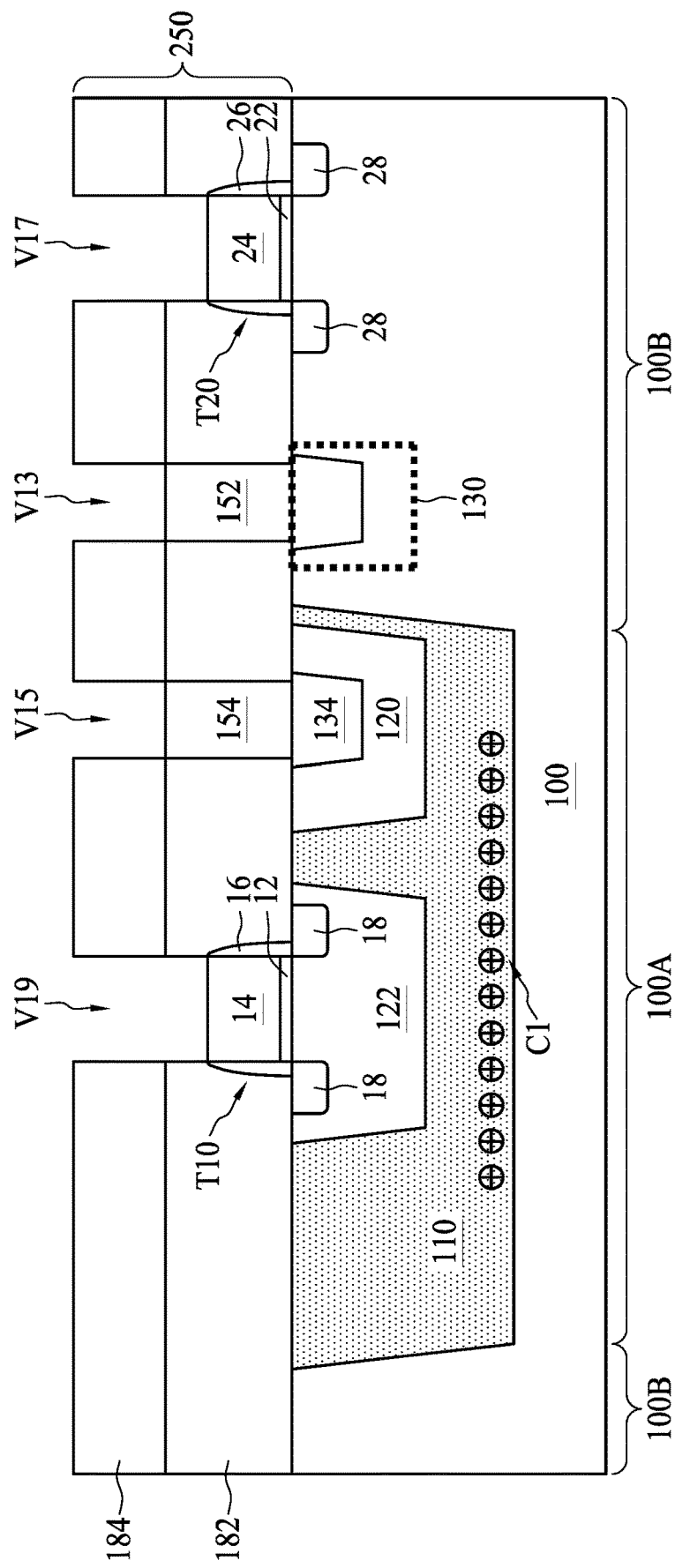

Continued from FIG. 32 and referring to FIG. 36, the second ILD layer 184 and the first ILD layer 182 are patterned to form trenches V13, V15, V17 and V19. In some embodiments, the trenches V17 and 19 respectively expose the underlying gate electrodes 24 and 14. In some embodiments, the trenches V13 and 15 respectively expose the underlying conductive vias 152 and 154.

Figure 37:
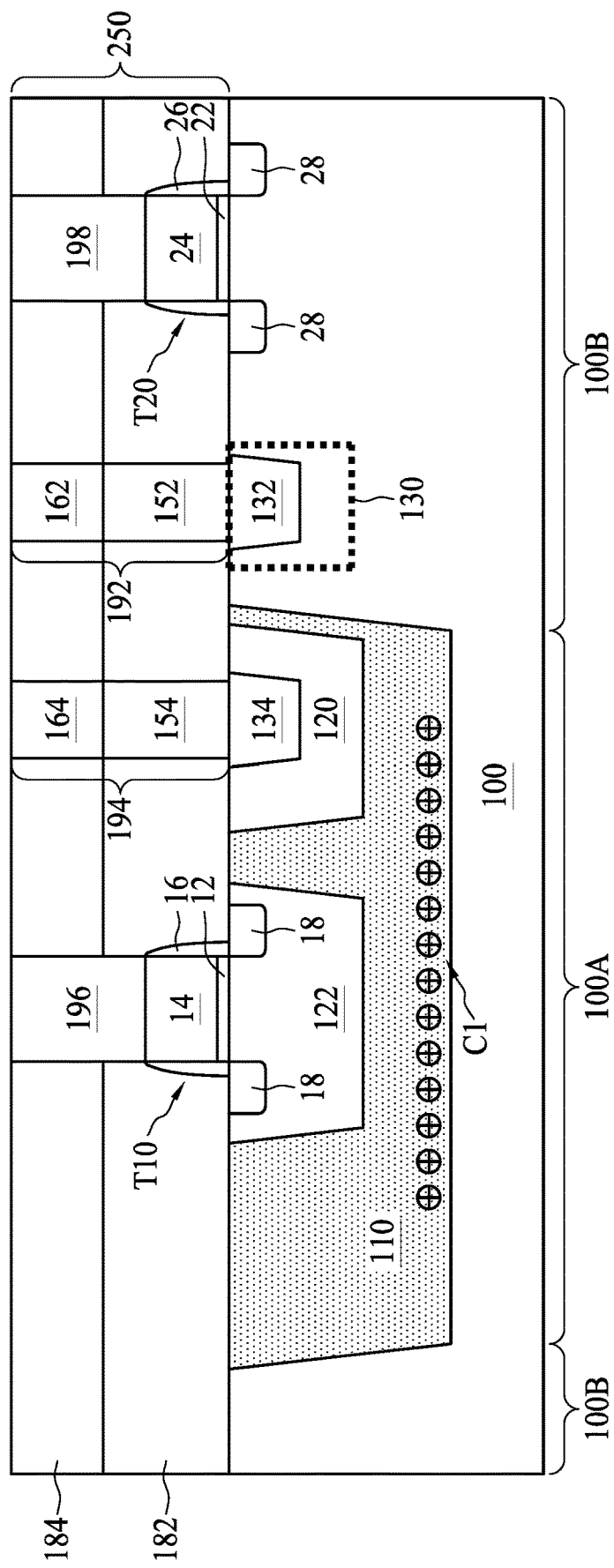

Referring to FIG. 37, conductive vias 162, 164, 196 and 198 are formed in the second ILD layer 184 and the first ILD layer 182 by depositing a conductive material into the trenches V13, V15, V19 and V17, Subsequently, a CMP operation may be performed to level the surface of the second ILD layer 184 to remove an excess conductive material. In some embodiments, the conductive vias 196 and 198 are respectively formed on and electrically coupled to the gate electrodes 14 and 24. In some embodiments, the conductive vias 162 and 164 are respectively formed on the conductive vias 152 and 154. In such embodiments, the conductive via 162 is electrically coupled to the conductive via 152 and the conductive via 164 is electrically coupled to the conductive via 154.

Figure 38:
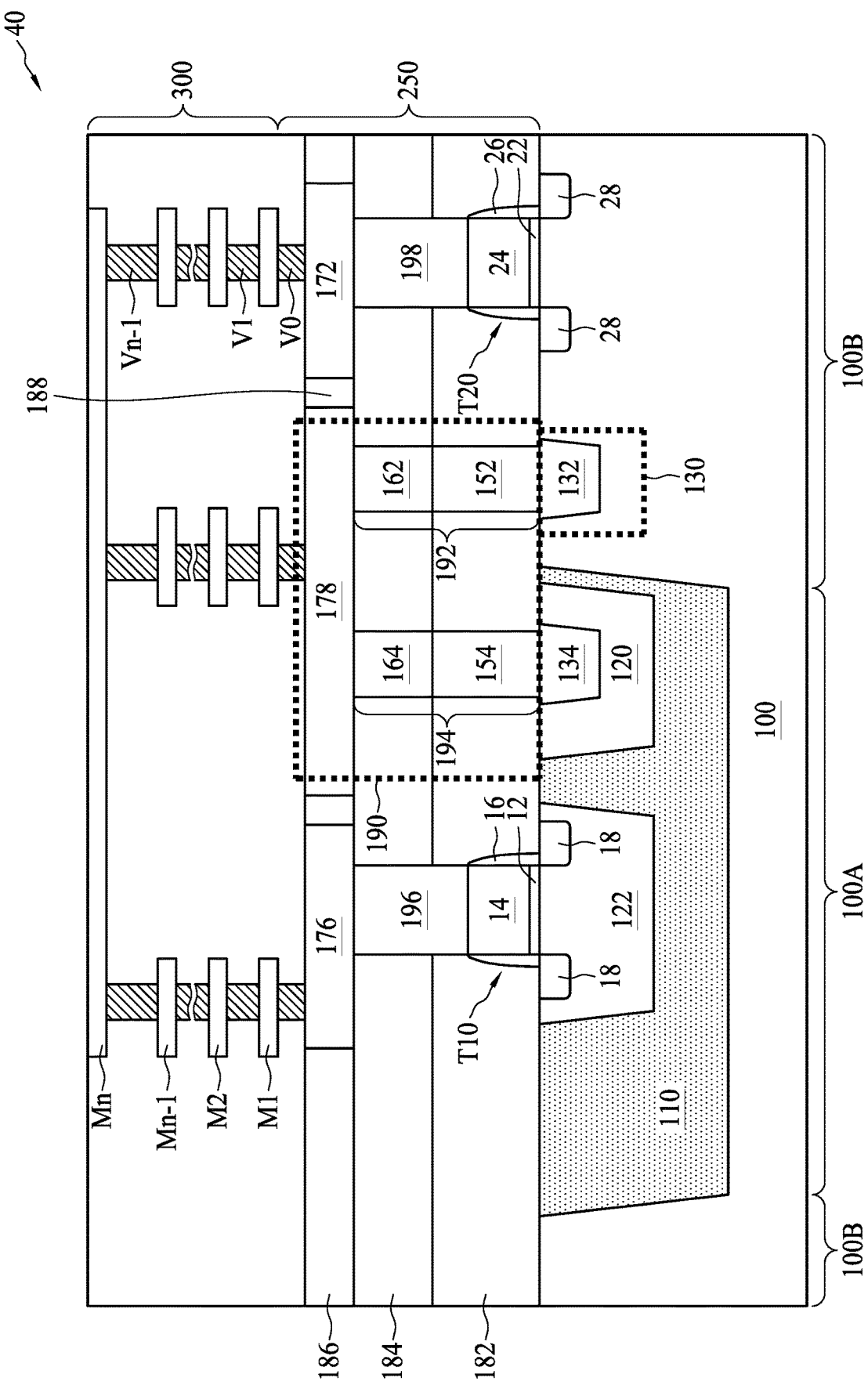
Figure 39:
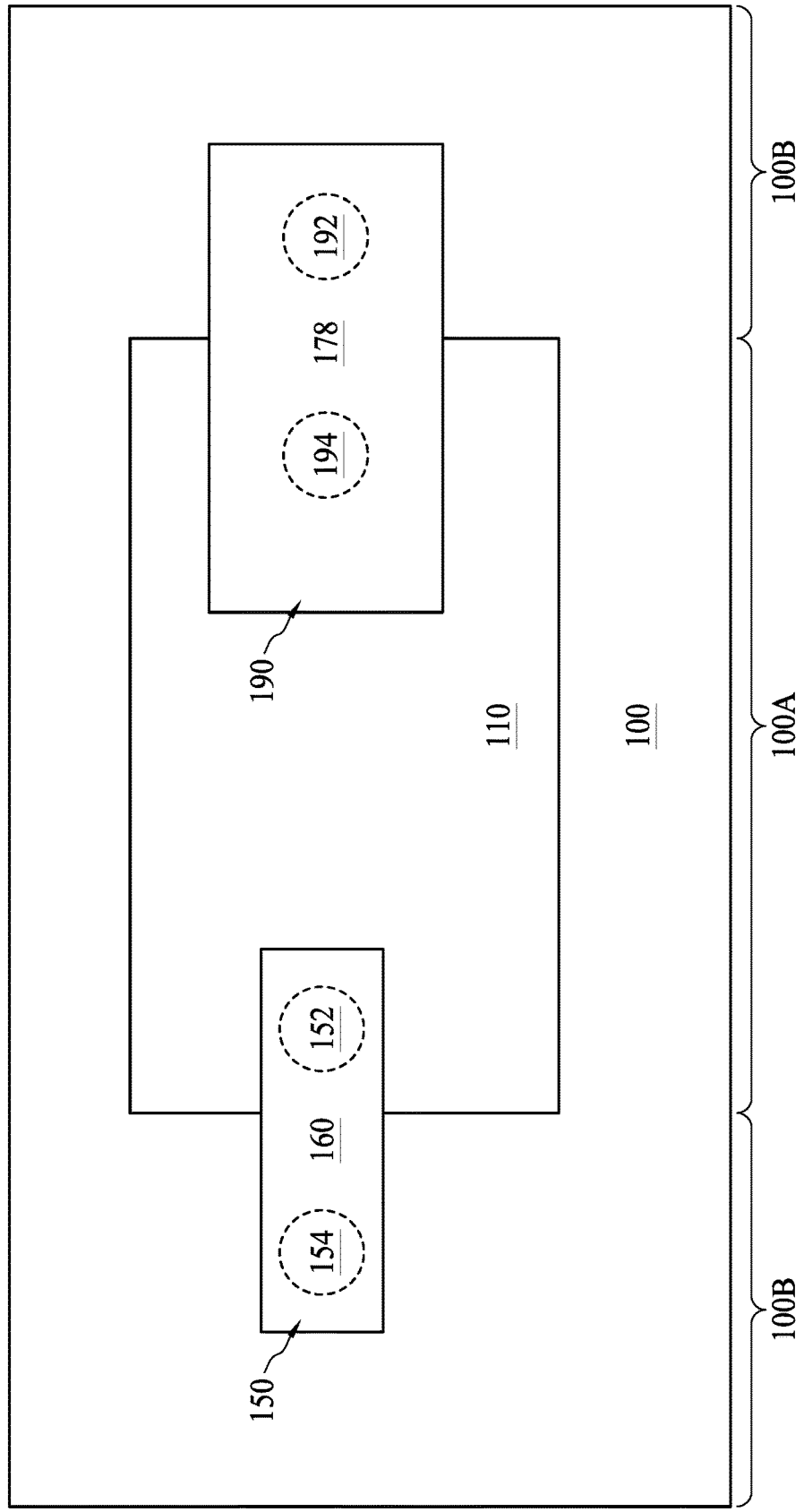
FIG. 39 is a schematic top view of a semiconductor structure, in accordance with some other embodiments of the present disclosure.

Referring to FIG. 38, a fourth semiconductor structure 40 may be fabricated by performing operations as shown in FIGS. 26 to 29 after the formation of the conductive vias 162, 164, 196 and 198 shown in FIG. 37. The fourth semiconductor structure 40 is similar to the second semiconductor structure 20 except for the differences that the fourth semiconductor structure 40 includes the conductive via 196 sandwiched between the gate electrode 14 and the metal line 176, and the conductive via 198 sandwiched between the gate electrode 24 and the metal line 172. In some embodiments, the conductive via 196 electrically couples the gate electrode 14 to the metal line 176, and the conductive via 198 electrically couples the gate electrode 24 to the metal line 172, FIG. 39 is a schematic top view of a fifth semiconductor structure 50, in accordance with some other embodiments of the present disclosure. The fifth semiconductor structure 50 may be formed using the method 200. The fifth semiconductor structure 50 is similar to the first semiconductor structure 10, the second semiconductor structure 20, the third semiconductor structure 30 or the fourth semiconductor structure 40 in many aspects, and descriptions of the similar features are omitted for brevity. In some embodiments, the fifth semiconductor structure 50 includes the first discharge structure 150 and the second discharge structure 150. The conductive via 152 of the first discharge structure 150 may be disposed over the first circuit region 100A while the conductive via 154 of the first discharge structure 150 may be disposed over the second circuit region 100B. The conductive member 194 of the second discharge structure 190 may be disposed over the first circuit region 100A while the conductive member 192 of the second discharge structure 150 may be disposed over the second circuit region 100B, A transistor may be disposed in the first circuit region 100A or in the second circuit region 100B. The forming operations of the first discharge structure 150 and the second discharge structure 190 may be referred to FIGS. 4 to 29. In some embodiments, charges accumulating in the DNW region 110 can be drained from the first circuit region 100A to the second circuit region 100B through the first discharge structure 150 or the second discharge structure 190, or both.

One aspect of the present disclosure provides a method. The method includes providing a substrate of a first conductivity type, the substrate including a first circuit region and a second circuit region; forming a first well region of a second conductivity type in the first circuit region of the substrate; forming a first doped region of the second conductivity type in the first well region; forming a diode in the second circuit region of the substrate; forming a first transistor and a second transistor over the substrate in the first circuit region and the second circuit region, respectively; forming a discharge structure over the substrate to electrically couple the first doped region to the diode; and forming a metallization layer over the discharge structure to electrically couple the first transistor to the second transistor subsequent to the forming of the diode, wherein the forming of at least one of the first doped region, the diode, the first transistor, the second transistor, the discharge structure and metallization layer includes a plasma-enhanced operation, which causes charges to accumulate in the first well region, and Wherein the charges are drained from the first well region to the substrate through the first doped region and the discharge structure.

One aspect of the present disclosure provides another method. The method includes providing a substrate of a first conductivity type, the substrate including a first circuit region and a second circuit region; forming a first well region of a second conductivity type in the first circuit region of the substrate; forming a first doped region of the second conductivity type in the first well region; forming a diode in the second circuit region of the substrate; forming a first transistor and a second transistor over the substrate in the first circuit region and the second circuit region, respectively; forming an interconnect layer over the first transistor and the second transistor to electrically coupled to the first transistor and the second transistor; forming a discharge structure in the interconnect layer to electrically couple the first doped region to the diode; forming a metallization layer over the interconnect layer, the metallization layer configured to electrically couple the first transistor to the second transistor wherein the forming of at least one of the first doped region, the diode, the first transistor, the second transistor, the interconnect layer, the discharge structure and the metallization layer includes a plasma-enhanced operation, which causes charges to accumulate in the first well region, and wherein the charges are drained from the first well region to the substrate through the first doped region and the discharge structure.

Another aspect of the present disclosure provides a semiconductor structure. The semiconductor structure includes a substrate of a first conductivity type. The substrate includes a first circuit region and a second circuit region. A first well region of a second conductivity type is disposed in the first circuit region of the substrate. A first doped region of the second conductivity type is disposed in the first well region. A second doped region of the second conductivity type is disposed in the second circuit region of the substrate. A transistor is disposed over the substrate. The transistor includes a gate electrode, a gate dielectric below the gate electrode, and source/drain regions on two sides of the gate electrode. A first conductive via is disposed over the gate electrode, A discharge structure is disposed over the substrate. The discharge structure includes a second conductive via having a bottom surface substantially level with a top surface of the first conductive via. The discharge structure forms a discharge path electrically coupled to the first doped region and the second doped region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a substrate of a first conductivity type, the substrate including a first circuit region and a second circuit region;
forming a first well region of a second conductivity type in the first circuit region of the substrate;
forming a first doped region of the second conductivity type in the first well region;
forming a diode in the second circuit region of the substrate;
forming a first transistor and a second transistor over the substrate in the first circuit region and the second circuit region, respectively;
forming a discharge structure over the substrate to electrically couple the first doped region to the diode, wherein the discharge structure directly contacts the diode; and
forming a metallization layer over the discharge structure to electrically couple the first transistor to the second transistor subsequent to the forming of the diode, wherein
the forming of at least one of the first doped region, the diode, the first transistor, the second transistor, the discharge structure and metallization layer includes a plasma-enhanced operation, which causes negative charges to accumulate in the first well region, and wherein the negative charges are drained from the first well region to the substrate through the first doped region, and the discharge structure and the diode, wherein
the first well region is an N-well region,
the diode includes a P-N junction at an interface between the substrate and a second doped region of the second conductivity type in the substrate, and
the discharge structure directly contacts the first well region.

2. The method of claim 1, wherein
the second doped region is an N-type doped region, and
the discharge structure directly contacts the N-well region and the N-type doped region.

3. The method of claim 1, further comprising forming a deep N-well (DNW) region in the first circuit region, wherein the first well region is formed within the DNW region.

4. The method of claim 3, wherein the negative charges are drained from the DNW region to the first well region, and to the substrate.

5. The method of claim 3, wherein the forming of the discharge structure comprises:
forming a patterned dielectric layer over the substrate, the patterned dielectric layer comprising a first trench and a second trench;
depositing a first conductive via in the first trench to electrically couple to the first doped region;
depositing a second conductive via in the second trench to electrically couple to the second doped region; and
forming a third conductive via in the patterning dielectric layer to connect the first conductive via to the second conductive via, wherein the negative charges are drained from the first well region to the substrate through the first, second and third conductive vias.

6. The method of claim 5, further comprising forming a gate via over the first transistor, wherein a top surface of the gate via is substantially level with a top surface of the first conductive via or the second conductive via.

7. The method of claim 3, further comprising forming a second well region of the second conductivity type in the first well region, wherein the first doped region is formed in the second well region.

8. The method of claim 7, further comprising forming a third well region of the first conductivity type in the first well region, wherein the third well region is separated from the second well region, and the first transistor is formed over the third well region.

9. The method of claim 8, wherein the negative charges accumulating in the first well region establish a voltage potential less than a breakdown voltage of a gate dielectric of the first transistor prior to the forming of the diode.

10. A method, comprising:
providing a substrate of a first conductivity type, the substrate including a first circuit region and a second circuit region;
forming a first well region of a second conductivity type in the first circuit region of the substrate;
forming a first doped region of the second conductivity type in the first well region;
forming a diode in the second circuit region of the substrate;
forming a first transistor and a second transistor over the substrate in the first circuit region and the second circuit region, respectively;
forming an interconnect layer over the first transistor and the second transistor, wherein the interconnect layer is electrically coupled to the first transistor and the second transistor;
forming a discharge structure in the interconnect layer to electrically couple the first doped region to the diode, wherein the discharge structure is in contact with the substrate;
forming a metallization layer over the interconnect layer, the metallization layer configured to electrically couple the first transistor to the second transistor wherein
the forming of at least one of the first doped region, the diode, the first transistor, the second transistor, the interconnect layer, the discharge structure and the metallization layer includes a plasma-enhanced operation, which causes negative charges to accumulate in the first well region, and wherein the negative charges are drained from the first well region to the substrate through the first doped region, the discharge structure and the diode, wherein
the first well region is an N-well region,
the diode includes a P-N junction at an interface between the substrate and a second doped region of the second conductivity type in the substrate, and
the discharge structure directly contacts the first well region and the second doped region.

11. The method of claim 10, wherein the forming of the discharge structure comprises:
depositing a first conductive via in the interconnect layer over the first doped region;
depositing a second conductive via in the interconnect layer, adjacent to the first conductive via, over the second doped region; and
depositing a third conductive via in the interconnect layer to connect the first conductive via to the second conductive via, wherein the negative charges are drained from the well region to the substrate through the third conductive via.

12. The method of claim 11, further comprising forming a gate via over the first transistor, wherein a top surface of the gate via is substantially level with a bottom surface of the third conductive via.

13. The method of claim 11 wherein the forming of the interconnect layer comprises:
forming a first interlayer dielectric (ILD) layer laterally surrounding the first transistor and the second transistor; and
forming a second ILD layer over the first ILD layer.

14. The method of claim 13, wherein the forming of the discharge structure comprises depositing a fourth conductive via in the second ILD layer, the fourth conductive via crossing a boundary of the first circuit region and the second circuit region from a top-view perspective.

15. The method of claim 13, wherein the forming of the discharge structure comprises depositing third ILD layer over the second ILD layer and forming a fifth conductive via in the third ILD layer, the fifth conductive via crossing a boundary of the first circuit region and the second circuit region from a top-view perspective.

16. A method, comprising:
providing a substrate of a first conductivity type, the substrate including a first circuit region and a second circuit region;
forming a DNW region of a second conductivity type in the first circuit region;
forming a first well region of the second conductivity type in the DNW region;
forming a first doped region of the second conductivity type in the first well region;
forming a second doped region of the second conductivity type in the second circuit region;
forming a first transistor over the first circuit region and a second transistor over the second circuit region; and
forming a discharge structure in contact with the substrate to electrically couple the first doped region to the second doped region, wherein
a first amount of static negative charge accumulated in the DNW region during the formation of the first doped region, the second doped region, the first and second transistors or the discharge structure is drained from the DNW region to the substrate through the first doped region, the discharge structure and the second doped region in the substrate, wherein
the first well region is an N-well region,
the second doped region is an N-type doped region, and
the discharge structure directly contacts the N-well region and the N-type doped region.

17. The method of claim 16, wherein during the forming of the discharge structure, at least a portion of the discharge structure crosses a boundary of the first circuit region and the second circuit region from a top-view perspective.

18. The method of claim 16, further comprising:
forming an interconnect structure over the discharge structure to electrically couple the first transistor to the second transistor; and
forming an interlayer dielectric layer surrounding the first transistor, the second transistor, the discharge structure and the interconnect structure.

19. The method of claim 18, wherein
a second amount of static charge is accumulated in the first well region during the formation of the interconnect structure and the interlayer dielectric layer, and
the second amount of static charge is drained from the first well region to the substrate through the first doped region, the discharge structure and the second doped region.

20. The method of claim 19, wherein the first amount of static negative charge and the second amount of static charge are generated during a use of plasma.

* * * * *